US011558133B2

(12) United States Patent
Heath et al.

(10) Patent No.: US 11,558,133 B2
(45) Date of Patent: Jan. 17, 2023

(54) PERFORMING ENVIRONMENTAL RADIO FREQUENCY MONITORING

(71) Applicant: Google LLC, Mountain View, CA (US)

(72) Inventors: Taliver Heath, Mountain View, CA (US); Mathew Varghese, Los Altos, CA (US); Andrew Clegg, Mountain View, CA (US); Karthik Yogeeswaran, Mountain View, CA (US)

(73) Assignee: Google LLC, Mountain View, CA (US)

( * ) Notice: Subject to any disclaimer, the term of this patent is extended or adjusted under 35 U.S.C. 154(b) by 57 days.

(21) Appl. No.: 15/733,864

(22) PCT Filed: May 29, 2019

(86) PCT No.: PCT/US2019/034323
§ 371 (c)(1),
(2) Date: Nov. 30, 2020

(87) PCT Pub. No.: WO2019/232004
PCT Pub. Date: Dec. 5, 2019

(65) Prior Publication Data
US 2021/0234623 A1    Jul. 29, 2021

Related U.S. Application Data

(60) Provisional application No. 62/679,676, filed on Jun. 1, 2018.

(51) Int. Cl.
*H04W 16/14* (2009.01)
*H04B 17/382* (2015.01)
(Continued)

(52) U.S. Cl.
CPC ......... *H04B 17/382* (2015.01); *G01R 23/005* (2013.01); *G01R 23/16* (2013.01); *H04W 16/14* (2013.01)

(58) Field of Classification Search
CPC .... H04B 17/382; G01R 23/005; G01R 23/17; G01R 23/16; H04W 16/14
See application file for complete search history.

(56) References Cited

U.S. PATENT DOCUMENTS

2004/0028123 A1    2/2004  Sugar et al.
2013/0322279 A1*  12/2013  Chincholi ............. H04L 43/106
                                                    370/252
2018/0083721 A1*   3/2018  Wada ................... H04B 17/309

FOREIGN PATENT DOCUMENTS

KR    20100069279 A    6/2010
KR    20160035022 A    3/2016

OTHER PUBLICATIONS

International Search Report and Written Opinion of the related PCT application PCT/US2019/034323 dated Sep. 11, 2019.
(Continued)

*Primary Examiner* — Quoc Thai N Vu
(74) *Attorney, Agent, or Firm* — Honigman LLP; Brett A. Krueger

(57) ABSTRACT

An environmental frequency sensing device, includes logic that performs signal strength (SS) level separation on a received band of frequencies to produce SS level separated frequencies. The logic performs frequency grouping on the SS level separated frequencies for each signal strength level to produce magnitude information for each grouping. The logic generates peak data by detecting peaks of the produced magnitude information. The logic generates an edge event indicating a signal edge based on arrival or departure of a given peak and compares, on a frequency basis, generated edges to stored fingerprint data of a signal of interest. Based on the comparison, the logic provides detected signal data indicating current use of a range of frequencies in an environment.

6 Claims, 20 Drawing Sheets

(51) Int. Cl.
    *G01R 23/00*     (2006.01)
    *G01R 23/16*     (2006.01)

(56)     References Cited

OTHER PUBLICATIONS

Korean Office Action for the related Application No. 10-2020-7036631, dated Oct. 8, 2021, 106 pages.

\* cited by examiner

US 11,558,133 B2

PERFORMING ENVIRONMENTAL RADIO FREQUENCY MONITORING

BACKGROUND OF THE DISCLOSURE

In a world of preassigned spectrum frequency use, such as frequency use of certain government agencies or for other particular commercial use, allowing the resharing of bands that are not in use is possible only if the previous incumbents are not using them. In some cases, the use of the radio frequency bands may be infrequent in a given location. Detecting the use of these radio frequencies in real time to reassign to new users so as to not interfere with the incumbents is a very difficult problem particularly on large bands and with narrow and infrequent uses. For example, government agencies may have been granted use of certain spectrum. One method of managing spectrum access for use by another set of users is to move the incumbent government users out of the spectrum such as to a different frequency band, or to detect when frequency bands are not in use and then temporarily assign the spectrum for use by others.

Existing radio frequency sniffers typically look for frequency uses on a single frequency at a time which can be too slow and too costly for attempting to detect unused frequencies in a timely manner to allow use by others.

BRIEF DESCRIPTION OF THE DRAWINGS

The disclosure will be more readily understood in view of the following description when accompanied by the below figures and wherein like reference numerals represent like elements, wherein.

SUMMARY OF THE DISCLOSURE

Figure 1:
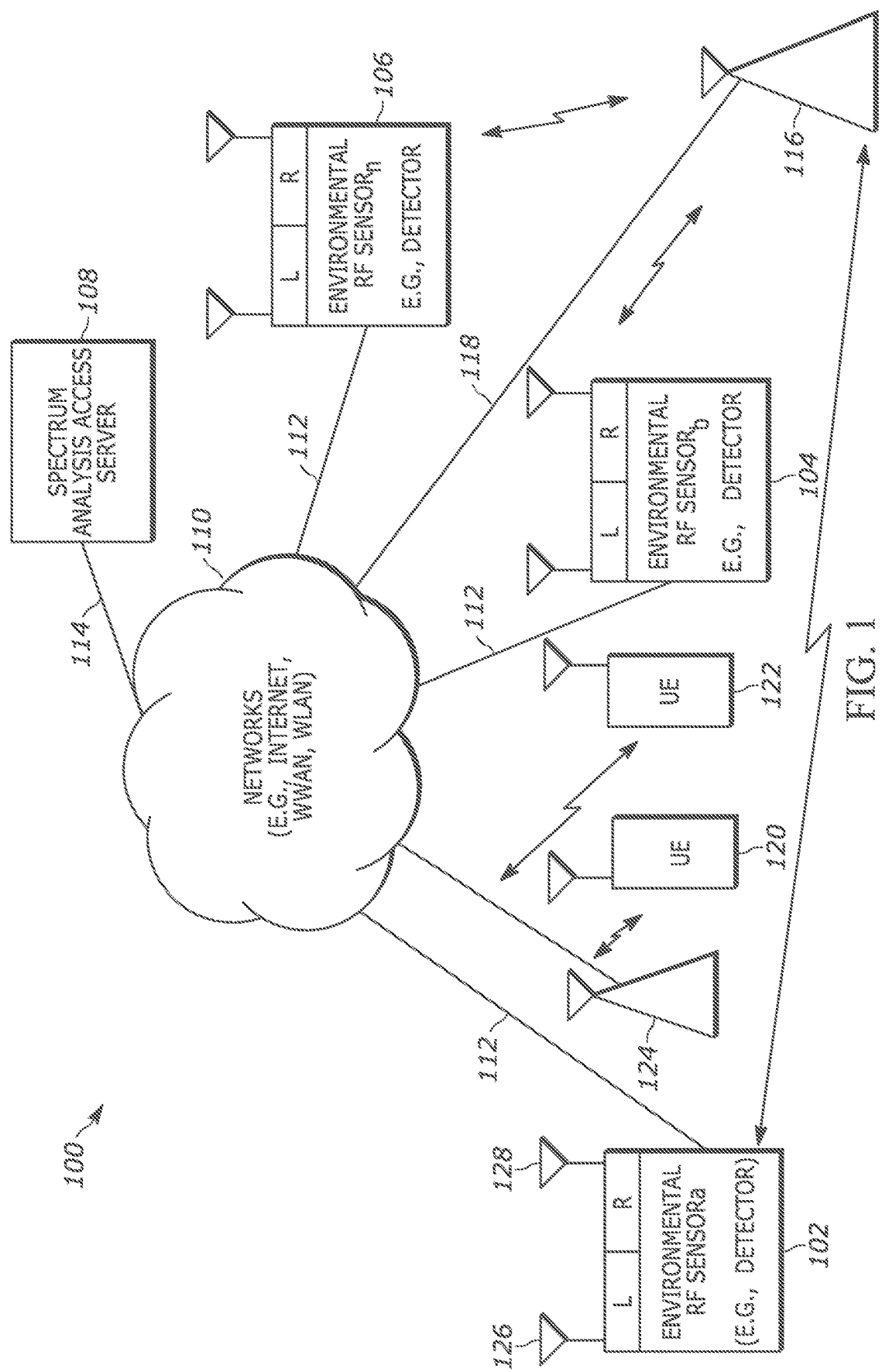
FIG. 1 is a block diagram of an example of a spectrum access system in accordance with one example set forth in the disclosure.

In one example, environmental radio frequency sensors (ERFS), also referred to as detectors, detect a large dynamic range of radio frequencies in real time without requiring complicated automatic gain control operations. In one example, a signal conditioner, such as an RF signal strength separator, breaks the incoming signal into two or more overlapping dynamic frequency ranges based on signal strength, thus allowing detection of a large dynamic range of radio frequencies. Each path associated with each overlapping dynamic range uses a series of transformations to detect frequency patterns such as both slow and fast pulses and chirps over a wide frequency range. The detected frequency patterns are compared to expected frequency patterns (e.g., fingerprints) and if a match is found frequency use is determined in the environment. Stated another way, each of the detectors performs a type of pattern matching of a broadband of frequencies divided in both low and high signal strength levels (or other signal strength levels). For example, one signal strength window may be −89 dBm to −34 dBm, while the other is −35 dBm to 20 dBm, giving 119 dB of dynamic range. Each detection over an aggregate noise threshold is then converted into a detection event which is output to a host unit. The host analyzes the edges as detected and looks for certain fingerprints by analyzing each on a case by case basis, which converts into a known pulse train. Each pulse train, from each antenna (e.g., left or right antenna) that detected the signal is broadcast to a cloud spectrum decision unit such as a spectrum access server (SAS) or other cloud component which compares against all other detectors. Using a logic map to aggregate the signals together, the detection is then declared and acted upon as designed.

For example, a coarse location of a transmitting RF signal source can be determined, and/or when government assigned frequencies are not being used, the frequencies can be assigned to other commercial users. Such a system may be employed as part of a spectrum access system (SAS). The spectrum access system may be, for example, part of the citizens broadband radio service (CBRS) to facilitate shared wireless broadband use of the 3550-3700 MHz band (3.5 gigahertz band), or with any other suitable radio frequency sharing system.

Each detector in one example includes a left and right antenna and performs real time edge up and edge down detection of frequencies over a large band. Each detector in one example, includes memory that stores fingerprints of signals of interest and determines whether a detected signal is a signal of interest by comparing the detected signal to the stored fingerprints. For example, one fingerprint may be created to look for a pulse of 1 MHz that lasts from 0.5 microseconds to 3.5 microseconds and repeats 10 times with a pulse repetition rate between 700 and 1100 times per second. However any suitable fingerprint information may be employed.

In some embodiments, if a fingerprint match of a signal of interest is detected, it is determined that the frequencies of interest are currently in use. A respective detector then sends the notification of the match to a cloud component as part of a spectrum access system. The spectrum access system obtains similar data from other detectors and if a number of detectors have detected the use of the same frequencies, the spectrum access server determines that the radio frequency is in use. Comparing fingerprint matches from multiple detectors allows for a reduction in false positives. If no match occurs, the detector continues to analyze frequencies and does not need to send information to the SAS.

In one example, the spectrum decision unit, such as a spectrum access server, uses the detected frequency information from each of the detectors to detect frequency usage in a portion of a geographic area. The geographic area may be, for example, within a city, along a coastline, within a rural area, or any other suitable geographic area. The system provides a coarse grain area detection of signal transmitters of given frequencies. Using the location of the detectors, the SAS locates a geographic location of a transmitter of the frequency such as a mobile or non-mobile base station if desired. Using redundant frequency detection results from the differing detectors also accommodates a situation where one of the detectors, has an error in detection, is out of service or for other reasons is unavailable. Using multiple detections from multiple detectors allows the SAS to validate that a particular detector obtained good data versus bad data. If bad data is determined to be coming from a detector repeatedly, the detector can be tagged as potentially defective and require movement or maintenance.

In some embodiments, an environmental frequency sensing device, includes logic that performs signal strength (SS) level separation on a received band of frequencies (e.g., 3550-3700 MHz) to produce SS level separated frequencies. The logic is also operative to perform frequency grouping on the SS level separated frequencies for each signal strength level to produce magnitude information for each grouping. The logic generates peak data by detecting peaks of the produced magnitude information. The logic generates an edge event indicating a signal edge based on arrival or departure of a given peak and compares, on a frequency basis, generated edges to stored fingerprint data of a signal of interest. Based on the comparison, the logic provides detected signal data indicating current use of a range of frequencies in an environment. In some embodiments the logic provides the detected signal data to a spectrum analysis access server.

In some embodiments a server, such as a cloud server, includes a spectrum decision unit operative to evaluate, from multiple environmental radio frequency (RF) sensors, the detected frequency data which is data representing that one or more RF frequencies has been detected by each of the multiple environmental radio frequency (RF) sensors in use. The server determines a geographic area corresponding to a source device transmitting the RF frequency detected to be in use using the multiple environmental radio frequency (RF) sensors and prevents user equipment located in the geographic area from using the RF frequency detected.

In some embodiments the server includes one or more processors and memory containing executable instructions that when executed by the one or more processors cause the one or more processors to perform the evaluation, determination and preventing noted above. The one or more processors also compare the data representing one or more RF frequencies detected by each of the multiple environmental radio frequency (RF) sensors to be in use, to each other and determine whether at least one of the environmental radio frequency (RF) sensors provided data containing error.

In some embodiments, a server determines a geographic area corresponding to a source device that is transmitting the RF frequency detected to be in use by the multiple environmental radio frequency (RF) sensors. In some embodiments, the server identifies frequencies that are not in use based on those that are detected to be in use and uses the information to facilitate use of the unused frequencies by user equipment in the area.

DETAILED DESCRIPTION OF THE DISCLOSURE

FIG. 1 illustrates one example of a spectrum access system 100 that employs one or more environmental frequency sensing devices 102, 104 and 106. The environmental radio frequency sensors 102-106 may be in communication with one or more spectrum analysis access servers 108 or any other suitable cloud component through one or more networks 110, such as but not limited to, the Internet and/or wireless wide area network and/or wireless local area network or any other suitable network or networks. The environmental frequency sensing devices may be linked to the spectrum analysis access server 108 through the network 110 via backhaul links generally shown as 112 or through any suitable wireless or wired connection as desired. Spectrum analysis access server 108 is also operably in communication with the network 110 through any suitable network interface generally shown as 114. A wireless spectrum transmitter 116 such as one or more base stations, mobile base stations or any other suitable radio frequency transmission device that wirelessly transmits over a band of frequencies is sensed by the sensing devices 102-106. In this example and the following figures, the system 100 will be made with reference to a CBRS system. However, any other suitable frequency bands may be employed. The wireless spectrum source 116 may be in communication with the network 110 through any suitable network communication link or links generally shown as 118.

The environmental frequency sensing devices 102-106 are positioned, for example, along a coastline, within any particular city location, rural location or any other suitable location in an effort to detect radio frequency transmissions emanating from the wireless spectrum source 116. The spectrum access system 100 may also include one or more user equipments 120 and 122 such as smartphones, laptops, wearables or any other suitable wireless devices that can use the frequencies of the broadband employed by wireless spectrum source 116 when the frequencies are available for use. As shown in this example, the UEs 120 and 122 are currently in communication with a different wireless spectrum source 124 but can be instructed to use the frequencies of the source 116 if the spectrum analysis access server 108 determines that the frequencies are available. UEs that are currently not in communication with any base station may also be candidates for use of the wireless spectrum employed by the wireless spectrum source 116.

In this example, each of the environmental radio frequency sensors 102-106 employ a left antenna 126 and right antenna 128. As used herein, an antenna can include any suitable antenna structure and the left and right antennas may include more than one antenna. In one example, each ERFS includes three antennas: a pair of receive antennas and a transmit antenna such as with a −10 dB coupling to the two receive antennas. The antenna pattern is designed to maximize the redundancy between ERFS sites by setting the gain maxima at an angle of 30° off bore site (e.g., for 3550 MHz, BW=45.6 deg. and for 3650 MHz, BW=44.6 deg.). This may be useful if a single ERFS is allowed to determine which quadrant of an antenna pattern a signal is arriving from and can do this cost effectively. The single ERFS performs this operation by doing a simplified two antenna angle of arrival detection by comparing amplitude of the two signals in the incoming phase. The gain would be approximately 18.5 dBi. By way of example, the disclosed system can accommodate a wide range of signal strength levels such as −89 dB to +20 dB or approximately 130 dB of range.

Figure 2:
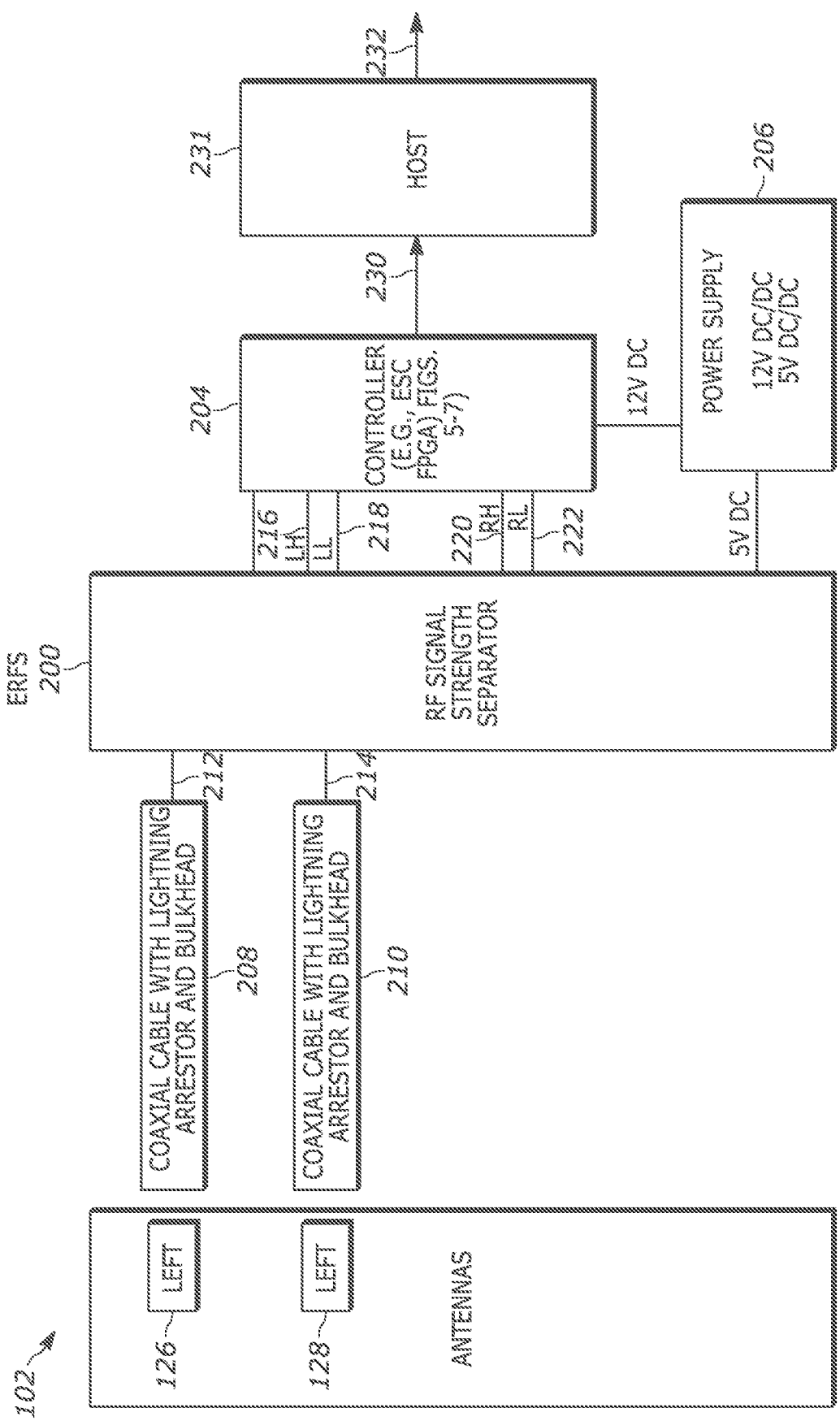
FIG. 2 is a block diagram illustrating one example of an environmental frequency sensing device in accordance with one example set forth in the disclosure.

Referring also to FIG. 2, an example of environmental RF sensing device 102 (i.e., sensor) is shown. The environmental RF sensing device 102 includes in this example, an RF signal strength separator 200, a controller 204, a host unit (e.g., processor) 231 and a power supply 206. The antennas 126 and 128 are connected to the RF signal strength separator 200 through, in this example, a coaxial cable illustrated as 208 and 210, respectively. The RF signal strength separator 200 can be implemented in any suitable fashion including, but not limited to, one or more processors and accompanying memory, interface logic, FPGAs, state machines, or any suitable logic. The controller 204 may also be implemented in any suitable fashion including but not limited to field programmable gate arrays, programmable processors, state machines or any other suitable logic. The environmental frequency sensing device 102 includes suitable memory such as RAM and ROM that stores data including thresholds and other information as well as executable instructions that when executed cause one or more processors to execute in a manner consistent with the disclosure. Any suitable apparatus may be employed.

Figure 4:
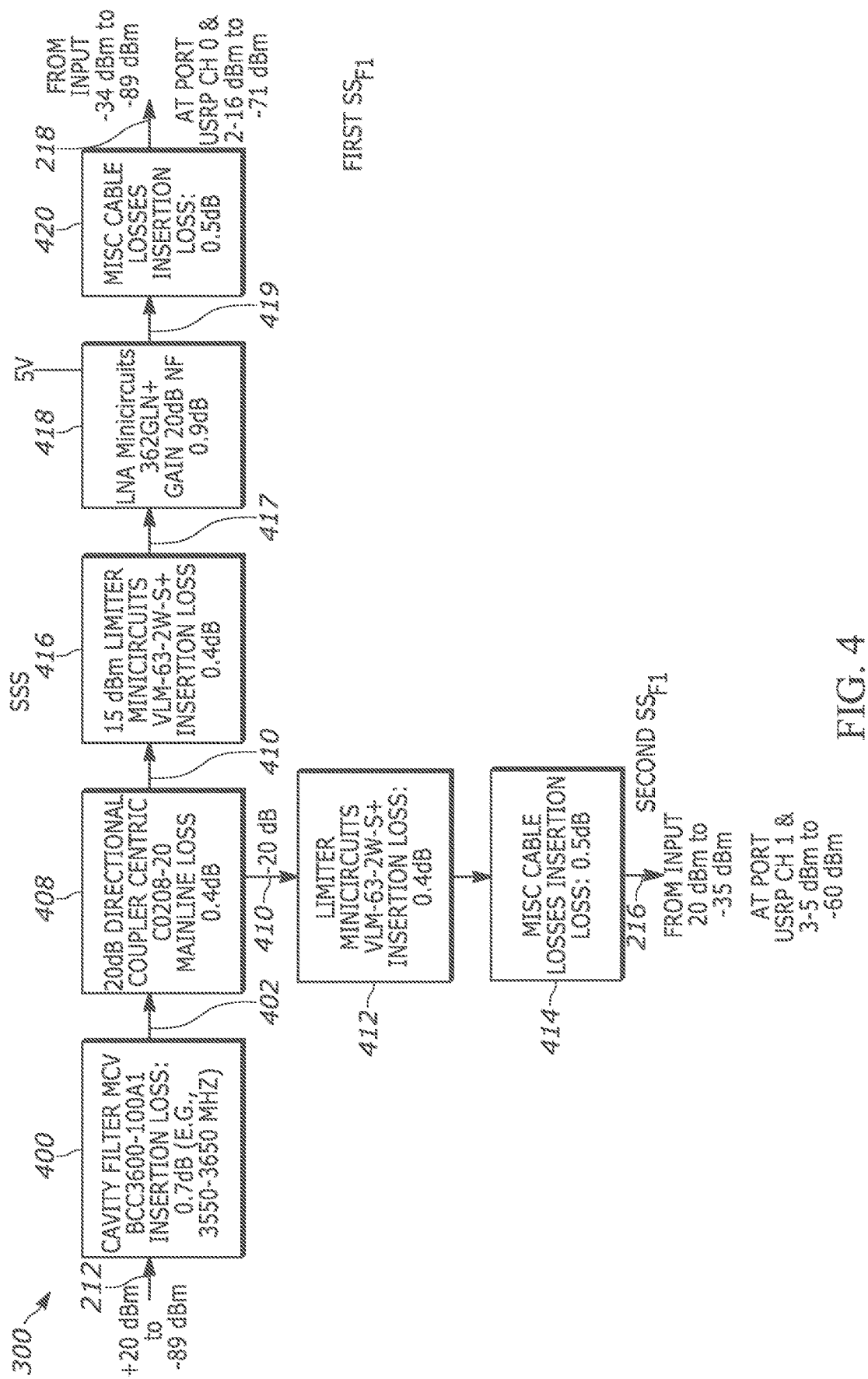
FIG. 4 is one example of a signal strength separator as referenced in FIG. 3 in accordance with one example set forth in the disclosure.

In one example, the RF signals strength separator 200, for each of the left and right antenna, performs signal strength level separation on the received band of frequencies from each antenna. The received band of frequencies is shown as signals 212 and 214, respectively. The output from the RF signal strength separator 200 is signal strength level separated frequency information that indicates those frequencies within the wide band of incoming frequencies from the left antenna that are above a high signal strength threshold shown as 216 and those frequencies within the same band that have a signal strength above a low threshold shown as 218, as illustrated in FIG. 4 for example. Similar signal strength level separation is performed resulting in right antenna high frequencies 220 and right antenna low frequencies 222 that exceed a low signal strength threshold. The controller 204 produces detected frequency information 230 for the host 231. The host 231 which performs a signal fingerprint analysis using stored fingerprint data of frequencies of interest on the detected frequency information 230 from each antenna and determines if frequencies of interest have been detected. The detected signal data 232 is sent to the spectrum analysis access server 108. The detected signal data 232 indicates current use of one or more frequencies in an environment, which is any geographic area of interest. In one example, out of a 100 MHZ window, a 0.875 MHz signal can be detected.

Figure 3:
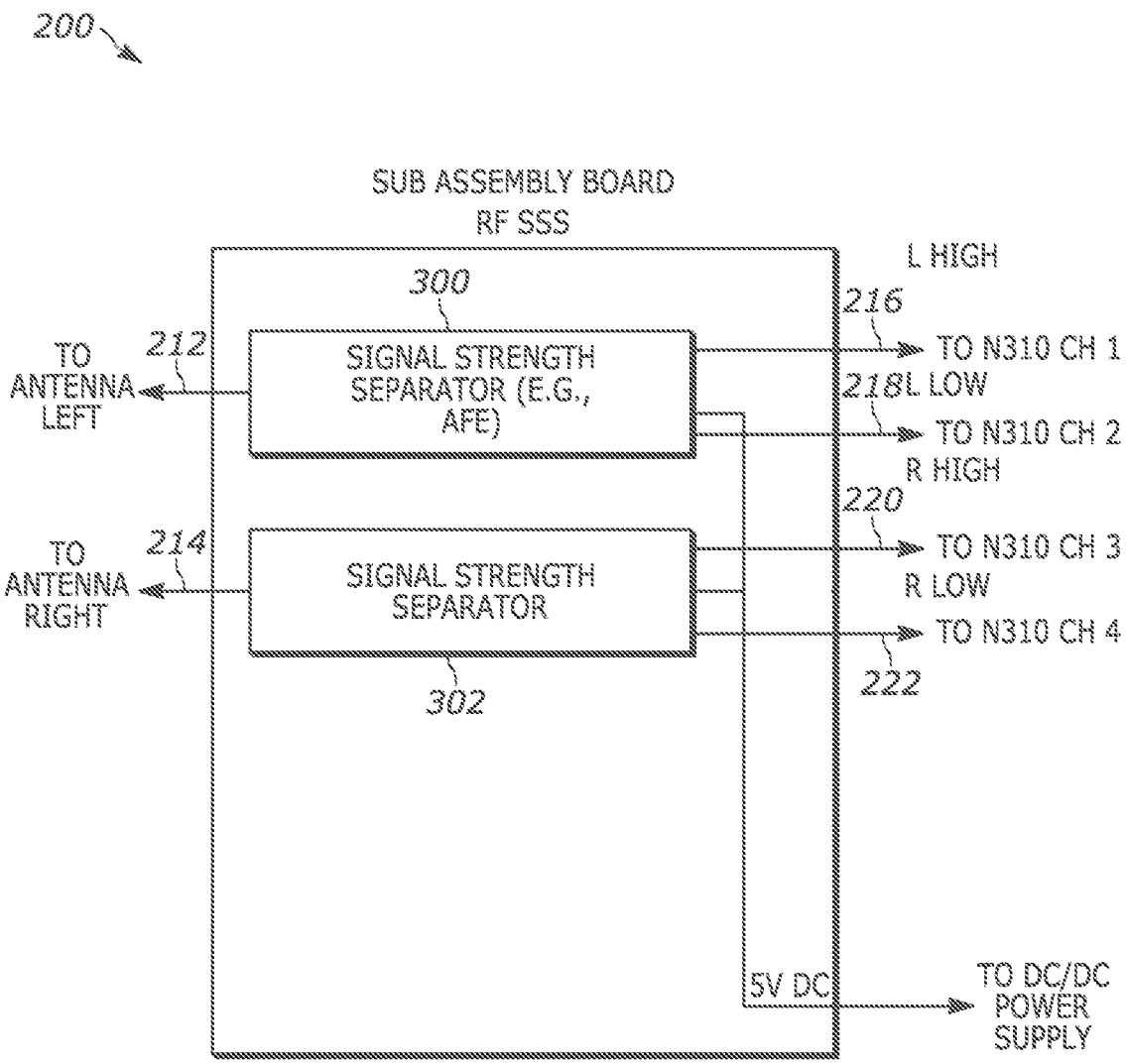
FIG. 3 is a block diagram of one example of a radio frequency signal strength separator in accordance with one example set forth in the disclosure.

Referring to FIG. 3, the signal strength separator 200 in this example includes a signal strength separator 300 for the left antenna and a signal strength separator 302 for the right antenna. FIG. 4 is one example of a signal strength separator 300 for the left antenna. In this example, the input range of −34 dBm to −89 dBm is amplified to −16 dBm to −71 dBm, while the high side takes the range of 20 dBm to −35 dBm and attenuates it to −5 dBm to −60 dBm. The band of frequencies 212 are received by the signal strength separator 300 and input through a cavity filter 400. As shown in this example, the received broadband of frequencies is over a range of 3550-3650 MHz. However any suitable range may be employed. The filtered output 402 is then input to another directional coupler 408. The output 410 from the directional coupler 408 is input to a limiter circuit 412. If desired, an accommodation of cable loss may be employed as shown in block 414. The output 216 is the left antenna high signal strength output in this example 20 dB to −35 dB of a signal that ranges from 20 dB to −89 dBm. The signal strength level separation resulting in output signal 218 which in this example has an overlapping signal strength of −34 dBm to −89 dBm includes passing the output 410 through a limiter circuit 416. The output 417 serves as input to linear noise amplifier circuit 418. Cable losses are accounted for as shown in block 420. The frequencies are the same for both the signal strength separator output signals 216 and 218 but only those that meet the thresholds for the signal strength levels are output. In this example, the high side provides a signal too quiet below −35 dBm.

Figure 5:
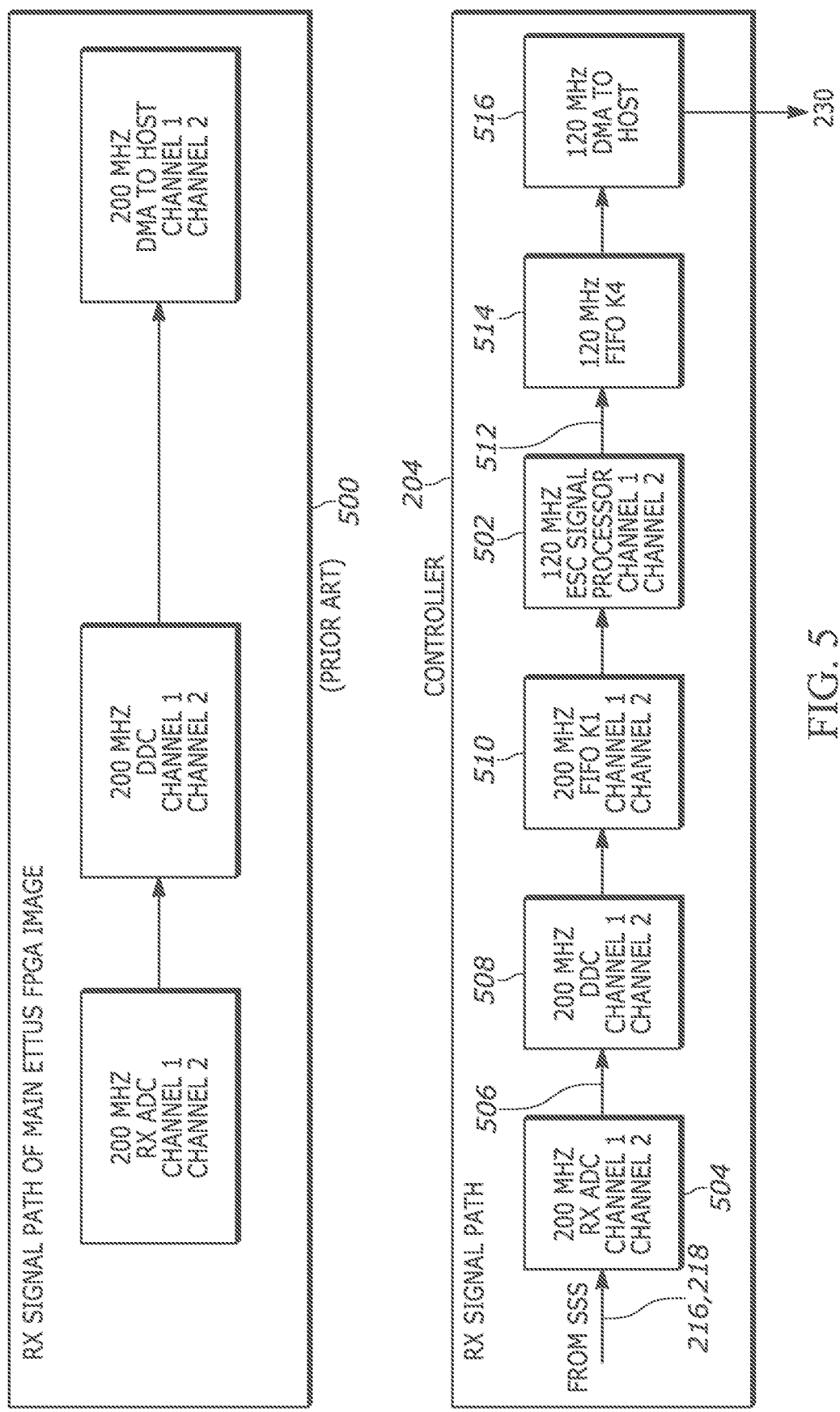
FIG. 5 illustrates a prior art controller and a controller in accordance with one example set forth in the disclosure.

FIG. 5 illustrates an example of the controller 204 as well as a prior art controller 500. As can be seen, the controller 204 includes an environmental sensing capability (ESC) signal processor 502 in addition to an analog to digital converter 504 that has an output 506 provided to a direct digital controller 508. In this example, the ESC signal processor 502 operates at 120 MHz so the 200 MHz clock DDC output is fed into a FIFO 510 at 200 MHz and read from the FIFO at 120 MHz. However, the FIFOs need not be employed if the ESC signal processor can operate at 200 MHz in this example. The output 512 from the ESC signal processor 502 is fed into a FIFO 514 to send data to the host 231 through a direct memory access block (DMA) 516.

Figure 6:
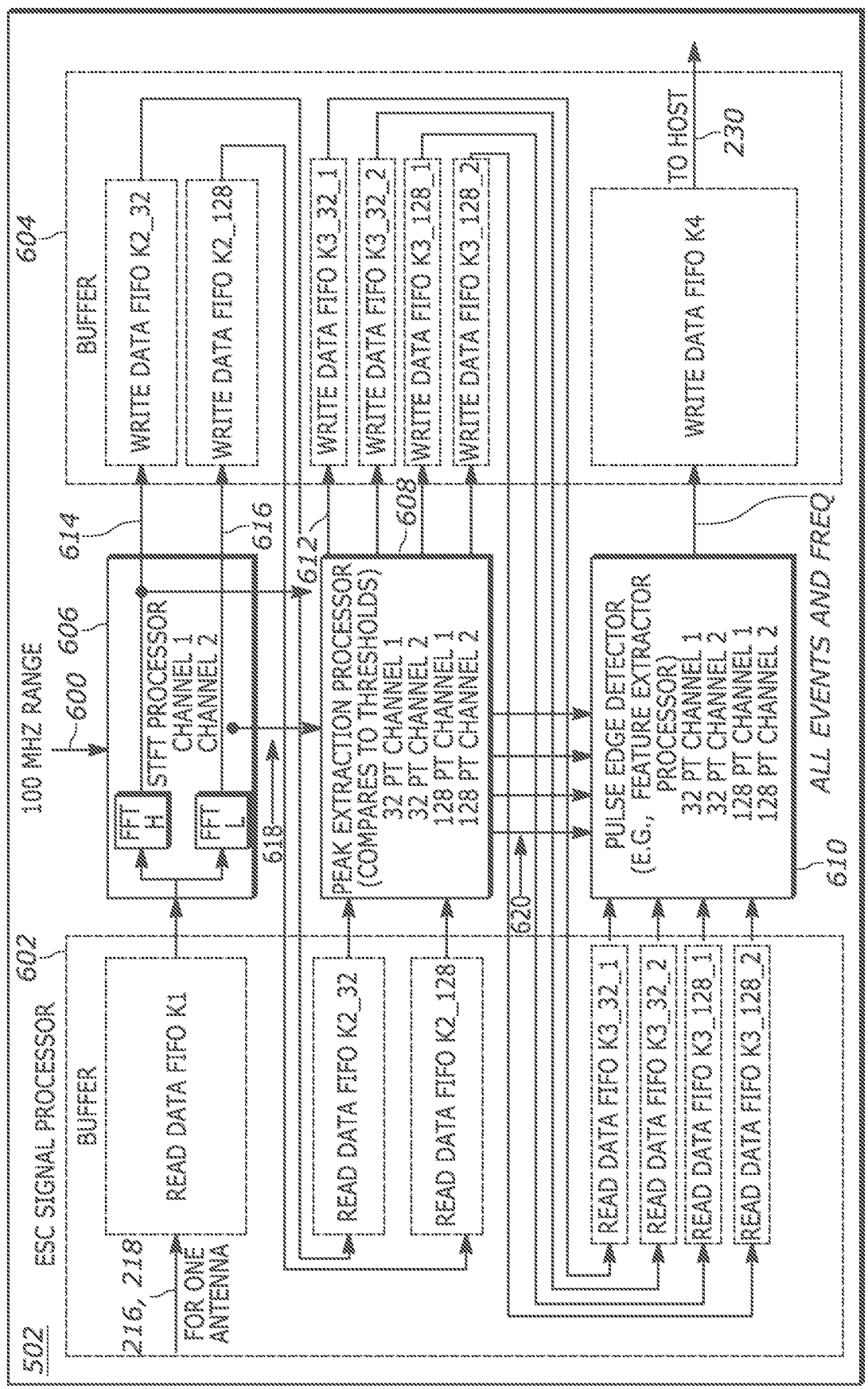
FIG. 6 is a block diagram illustrating one example of a controller in accordance with one example set forth in the disclosure.

FIG. 6 illustrates one example of the ESC signal processor 502 which uses a sub-band range, in this example, 100 MHz shown as 600 of the band of frequencies (in this example, 3550-3650 MHz). In this example, additional FIFO buffers 602 and 604 are employed to buffer read data and write data. However, they need not be employed if desired. The ESC signal processor 502 includes an STFT processor 606, a peak extraction processor 608 and a pulse edge detector 610. Arrows 618 and 620 represent an embodiment where no FIFOs are used.

Input Sampling

In some implementations, input data is sampled at 100 MSps or higher (higher in the case of the x310 where the fractional decimation filter doesn't have enough alias rejection) on 2 input channels.

STFT Processor

Figure 7:
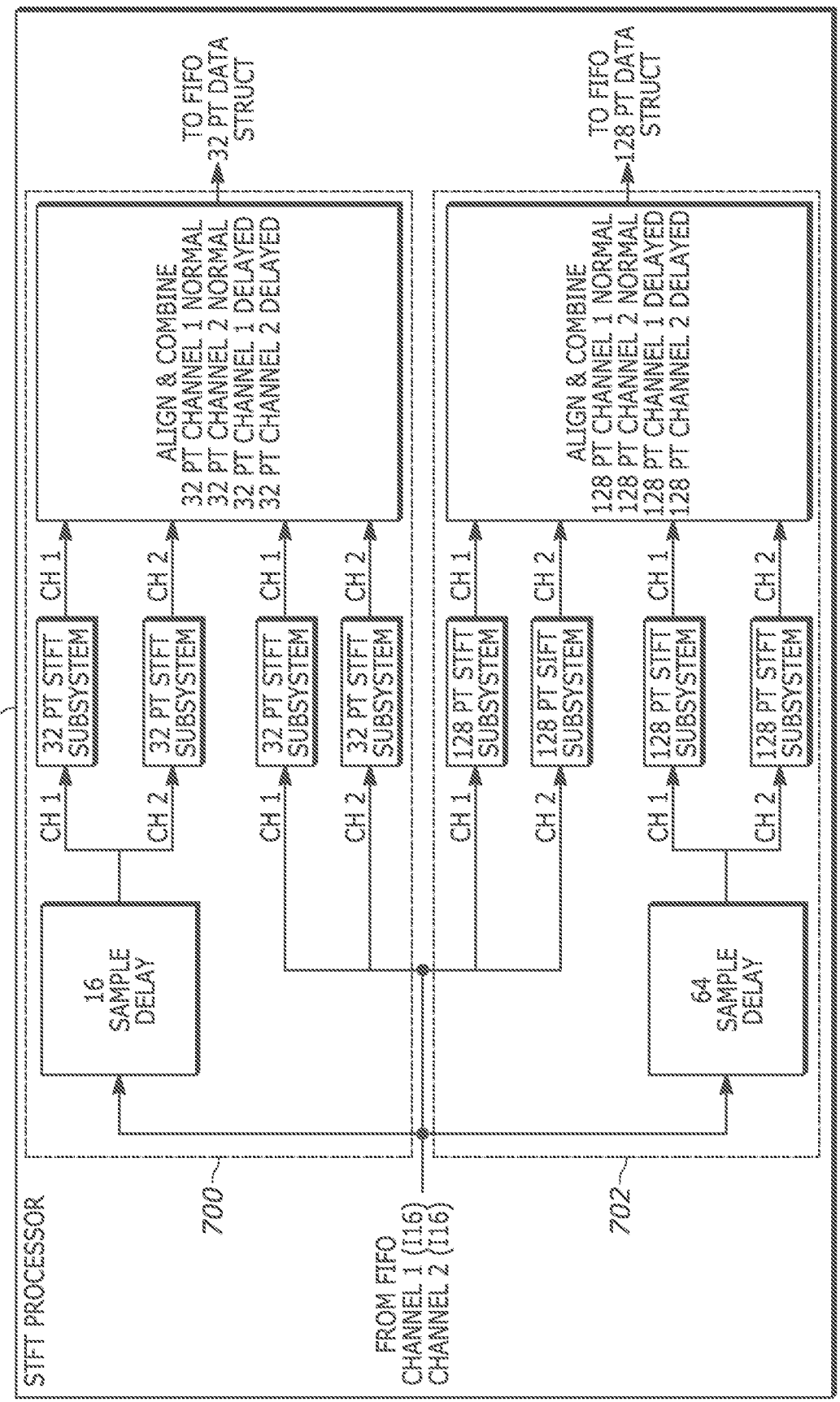
FIG. 7 illustrates one example of a short time Fourier Transform (STFT) processor in accordance with one example set forth in the disclosure.
Figure 8A:
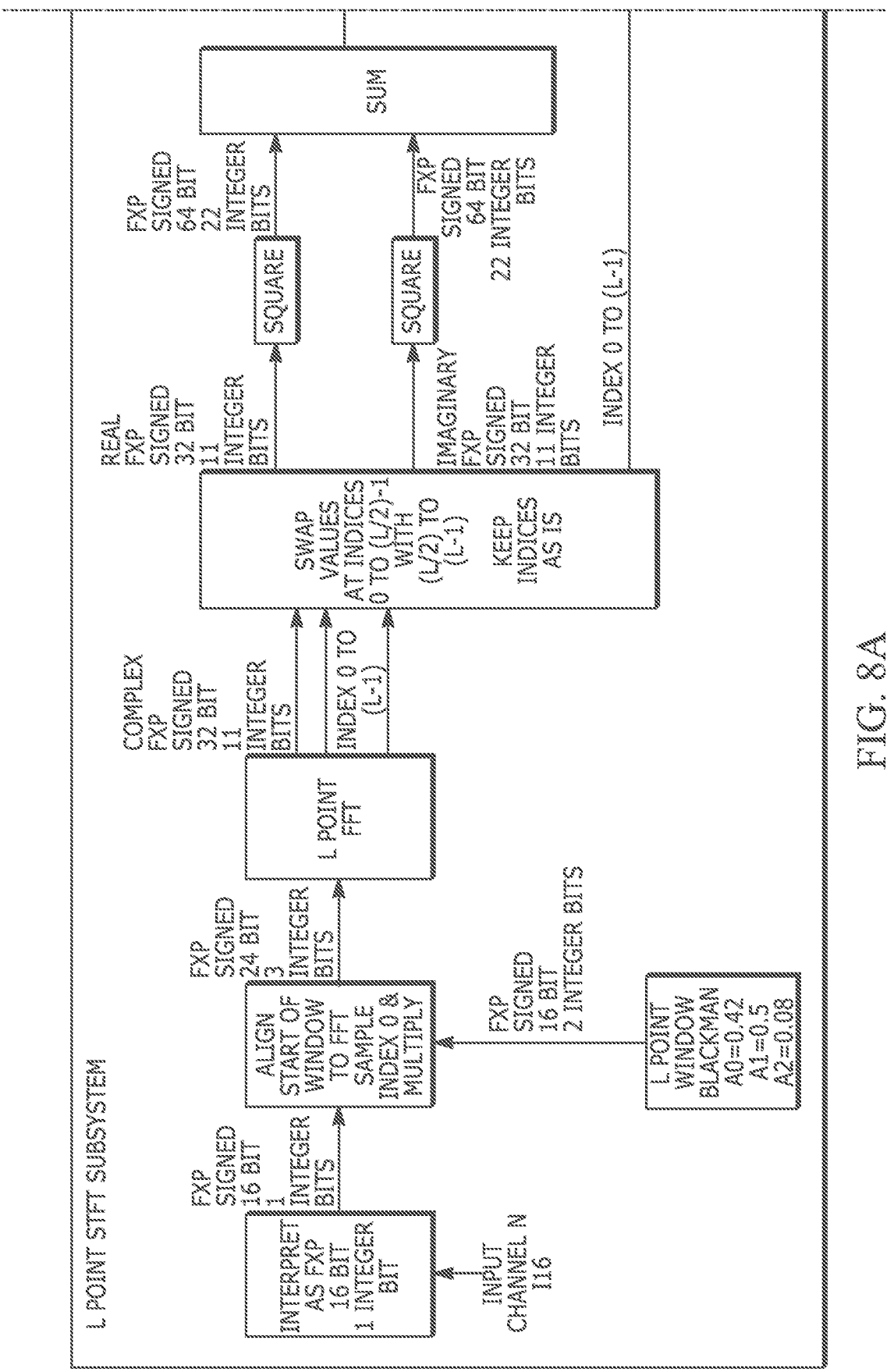
FIGS. 8A-8B are block diagrams illustrating one example of an STFT subsystem illustrated in FIG. 7 in accordance with one example set forth in the disclosure.
Figure 8B:
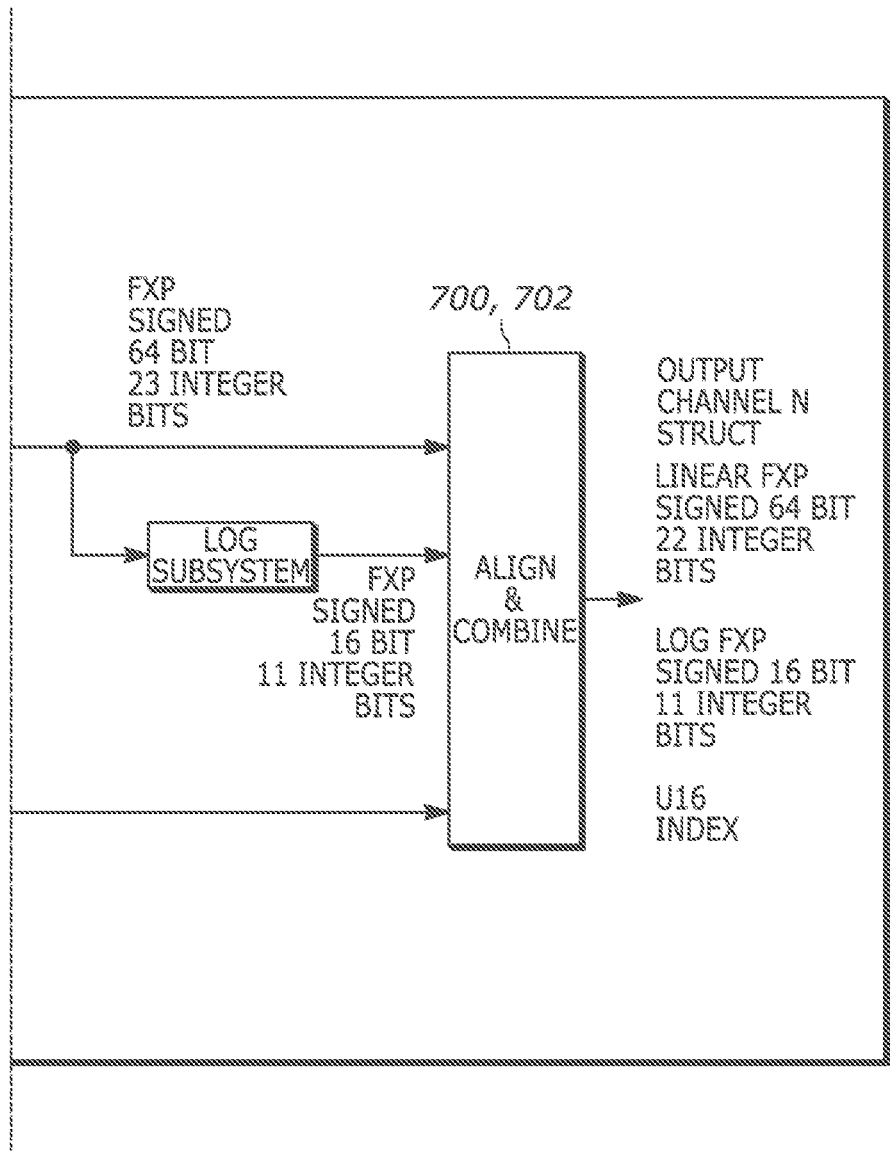

Referring to FIGS. 7, 8A and 8B, in some examples, the IQ data cannot directly be used to detect thresholds because the noise power over the 100 MHz bandwidth may provide an inadequate signal to noise ratio (SNR). Fast Fourier transforms (FFTs) 700 and 702 are employed to increase the SNR for any frequency bin which may contain a radar frequency range in the case where radar frequencies are frequencies of interest. The P0N type radars want a frequency bandwidth of approximately 1 MHz so a 128 point FFT is used which at a sample rate of 112 MSps gives a frequency resolution of 875 kHz with a time resolution of 1.14 us. As the shortest radar is 500 ns this leads to an SNR degradation of worst case −3.6 dB with no degradation under most of the radar test conditions. The following criteria was taken into account for a radar example, however, any suitable frequency range or suitable wireless transmitter can be employed:

The Q3N type radars are chirped (chirps can also be referred to as pulse radars) and so the frequency bandwidth is less important that the time/frequency block size. The SNR is a tradeoff between having too wide a bandwidth causing the noise power to rise and the too slow a time resolution causing the average power over the period to drop due to the radar occupying only a fraction of the time period.

Q3N #1 is the fastest chirp at a speed of 10 MHz/us to 33 MHz/us. A 32 point FFT running at a sample rate of 112 MSps would give a frequency bin of 3.5 MHz and a time resolution of 286 ns. During this period the chirp occupies 2.86 MHz to 9.4 MHz giving an SNR degradation of ~−0.8 dB and ~−4 dB at the extremes and 0 dB SNR degradation at 12.24 MHz/us.

Q3N #2 and Q3N #3 are slower chirps with speeds ranging from ~0.1 MHz/us to 2 MHz/us. For these slow speeds the 128 point FFT output would yield at most a 4 dB degradation of SNR with no degradation under most radar test conditions.

The input data is windowed to prevent spectral leakage/scalloping loss. A blackman window with coefficients (a0=0.42, a1=0.5, a2=0.08) was used.

To prevent the sensor from missing a radar which occurs during the attenuated portion of the window function, 2 FFTs are taken for each FFT length, offset in time by half the FFT length this leads to a total of 2 channels×2 FFT lengths×2 time offsets=8 FFTs per sample.

The real and imaginary values are squared and summed (but the square root is not calculated). The linear value for this is output.

$20*\log_{10}(sqrt(Re^2+Im^2))=3.0103*\log_2(Re^2+Im^2)$ which avoids the need to calculate a square root allows use of log base 2.

Log base 2 is calculated using the Log 2 LUT technique. This can be simplified by converting the number to single precision floating point. IEEE-754 uses log base 2 and so the 8 bit exponent can be used as the whole number portion after removing the 127 bias. The significand portion can be quantized and used as the index to lookup from a 64 sample log base 2 LUT where each sample of index $i=\log_2(1+(i/64))$.

The result of log function and the linear function for all 8 FFT streams are aligned and output into a FIFO.

Peak Extraction Processor

Figure 9:
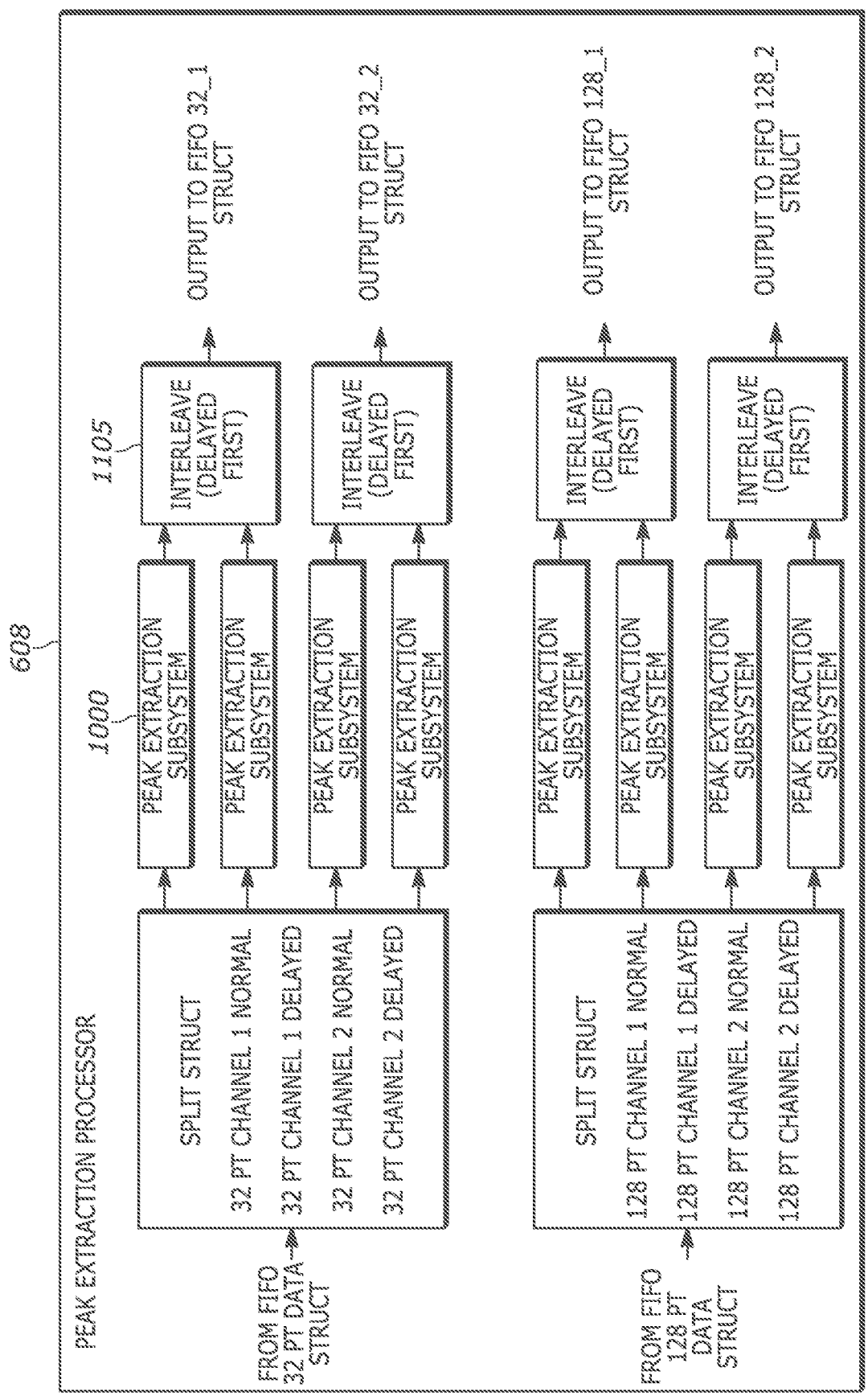
FIG. 9 is one example of a peak extraction processor in accordance with one example set forth in the disclosure.
Figure 10:
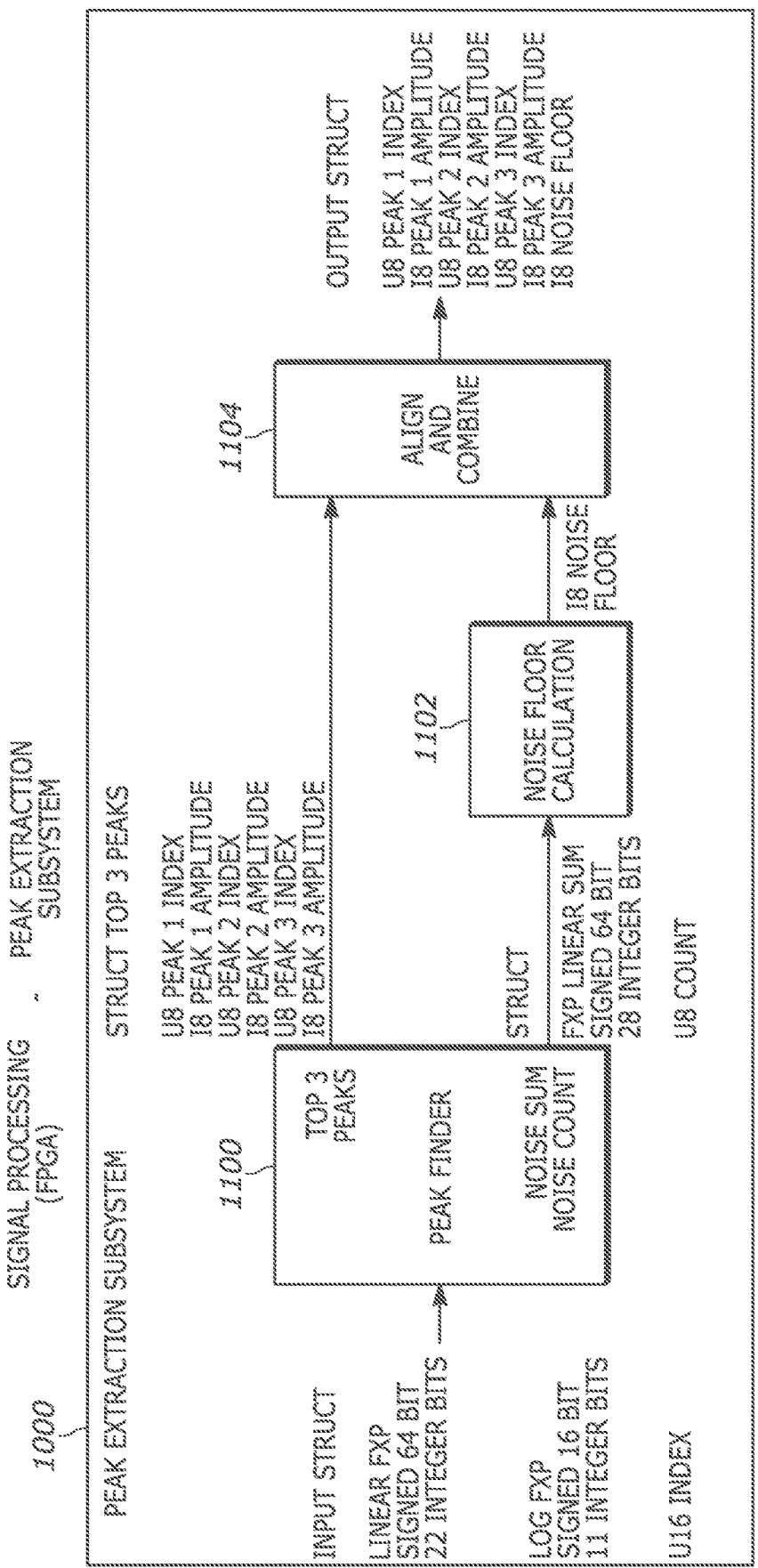
FIG. 10 illustrates one example of a peak finder employed within the peak extraction subsystem in accordance with one example set forth in the disclosure.

Referring to FIGS. 9-10, for each of the FFT streams 614, 616 there is a peak extractor 1000 which operates on the frequency domain data. The first stage also referred to as the peak extractor 1100, determines what are the top 3 peaks (local maxima) of the spectrum and what is the linear sum and count of the remaining samples. It uses this latter information to determine the average of the non peak samples which it treats to be the noise floor. This assumption is fair as the probability of more than 3 radars each with duty cycles ranging from 0.1% to 30% to simultaneously appear in the FFT is extremely low. The one condition where the noise floor will show erratic values is when the ADC is saturated. This can be used as part of a detection algorithm at the host to determine when data can be ignored as it is saturated. The peak value and FFT bin index for the top 3 peaks are stored for output to the FIFO. The peak value is truncated from a fixed point value to an int8 to minimize the size of the data and because accuracy of less than 1 dB is not required by subsequent stages.

The second stage 1102 takes the linear sum and count values from the FFT, performs a division to determine the average value and then using the same logarithm technique used in the STFT block it determines the logarithm of the average value giving the log of the noise floor.

The third stage 1104 aligns and combines the log noise floor value and the peak values into places it into a struct and sends it to an output FIFO.

This code block accounts for the scenarios where the sampling bandwidth is greater than the bandwidth of the detection of signals by using a Boolean mask of the length of the FFT with a True for all the indices which correspond to a frequency bin within the detection band. The value from the Boolean array corresponding to the index of the FFT value is used in an AND gate with the 'data valid' flag which would thereby cause the peak detection algorithm to ignore the samples of the masked values.

The next stage 1105 interleaves the two time offsets of each of the 4 FFT streams (2 channels×2 FFT lengths). The order of interleaving must be carefully done to prevent a single pulse at a certain frequency in time to look like 3 pulses. The delayed stream data counterintuitively comes first. This is because the delay works by inserting zeros at the front of the data stream so the first FFT it is calculating the spectrum of only the first half of the time data so that means that in time this FFT comes first.

The goal of the peak finder process is to make a streaming peak finder which outputs the integer log value and the frequency bin index for the top 3 local maxima for each FFT data stream and sums up the linear values and count for all the remaining elements of the FFT.

To accomplish this goal the program uses a struct with the following elements (FFT start index U8, FFT stop index U8, Max index U8, Max value FXP s16.11, count U8, linear sum FXP s64.28). The FFT start index represents the first element index of a given peak which occurs at the first rising element or first element of the FFT. The FFT stop index represents the last element that is part of the same peak (i.e. the last element before the next first rising element). The Max index and Max value represent the value from the input of the largest value between the start and stop indices. The count is a tally of the number of elements that are part of the peak and the linear sum is the sum of all the linear input values between the start and stop indices.

The program keeps 4 of these structs in memory. The first is the current_state struct. The other three structs represent the struct for the top 3 peaks (Peak1, Peak2, Peak3). In addition there is a fifth struct which has (count U8, linear sum FXP s64.28) called the noise_floor which is used to accrue the linear sum and count for any peak which is supplanted from the top 3 peak structs.

The program works by checking each new element to see if it is the first element of the FFT or the first rising element (i.e. a high value following a low value following a higher value). In either of these conditions the program assumes that the previous state struct is closed and it updates the 3 peak value structs and the noise_floor struct (this process is explained in the next paragraph). If it is the first element of the FFT then the 3 peak structs are output from this block as is the noise_floor struct. In the clock cycle after this the noise_floor struct and all 3 peak value structs are cleared.

The decision to update the 3 peak values and noise_floor structs are performed by first comparing the max value of the 3 peak value structs and then determining the struct with the smallest value. The peak value struct with the smallest value's Max value is then compared to the current_state struct's Max value. If the current value is smaller, the peak value structs are left alone and instead the count and linear sum elements of the current_state structs are added to the noise floor struct. If the current value is larger, then the count and linear sum from the peak value are taken and added to the count and linear sum of the noise_floor struct and afterwards that particular peak value struct is replaced by the current_value struct.

For the linear sum steps a signed 64 bit with 28 integer bits is used to accrue the linear sum values. When samples are output from this block they are output as two structs. The first struct takes the Max index cast as a U8 type and Max value cast as a U8 type for each of the top 3 peaks. The noise_floor struct is output without changing the data type.

Figure 11:
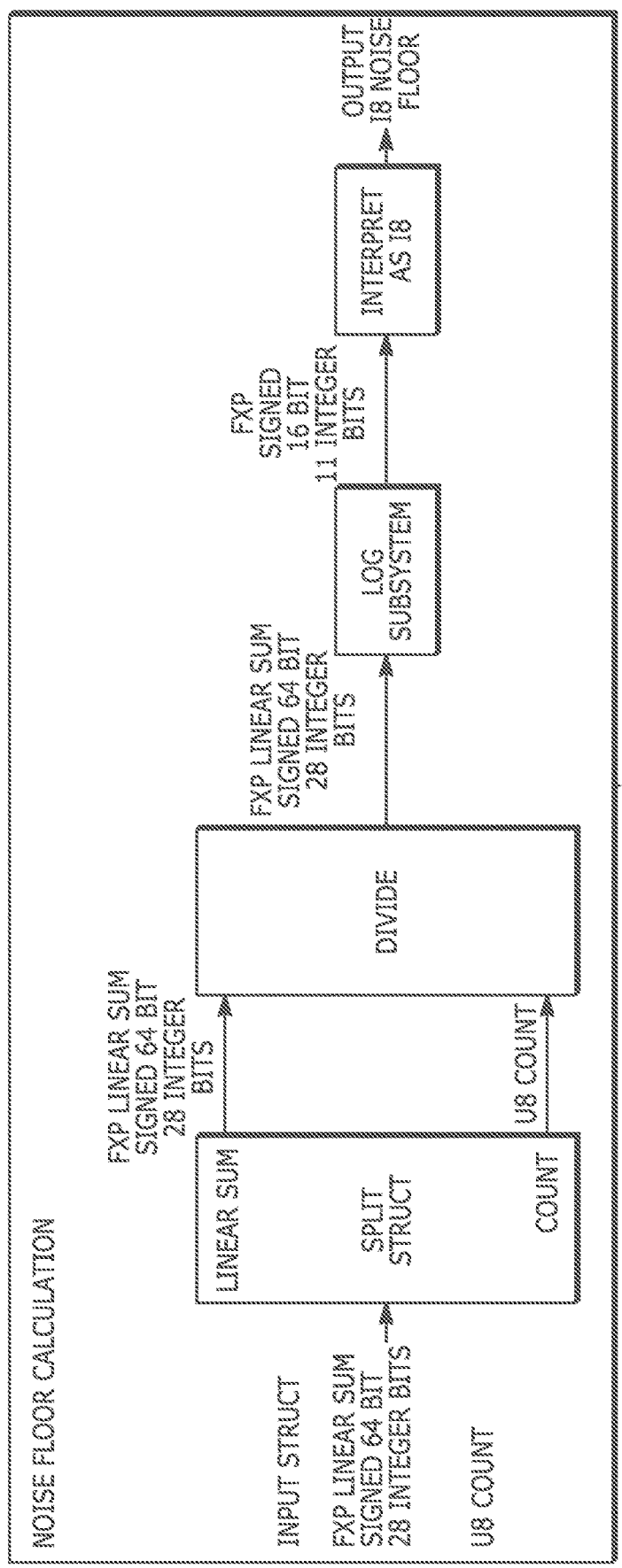
FIG. 11 is a block diagram illustrating one example of noise floor calculation process in accordance with one example set forth in the disclosure.

FIG. 11 shows the flow for the noise floor calculation. The noise flor calculation effectively sums all of the values that are not in the top three.

Feature Extractor Processor

Figure 12A:
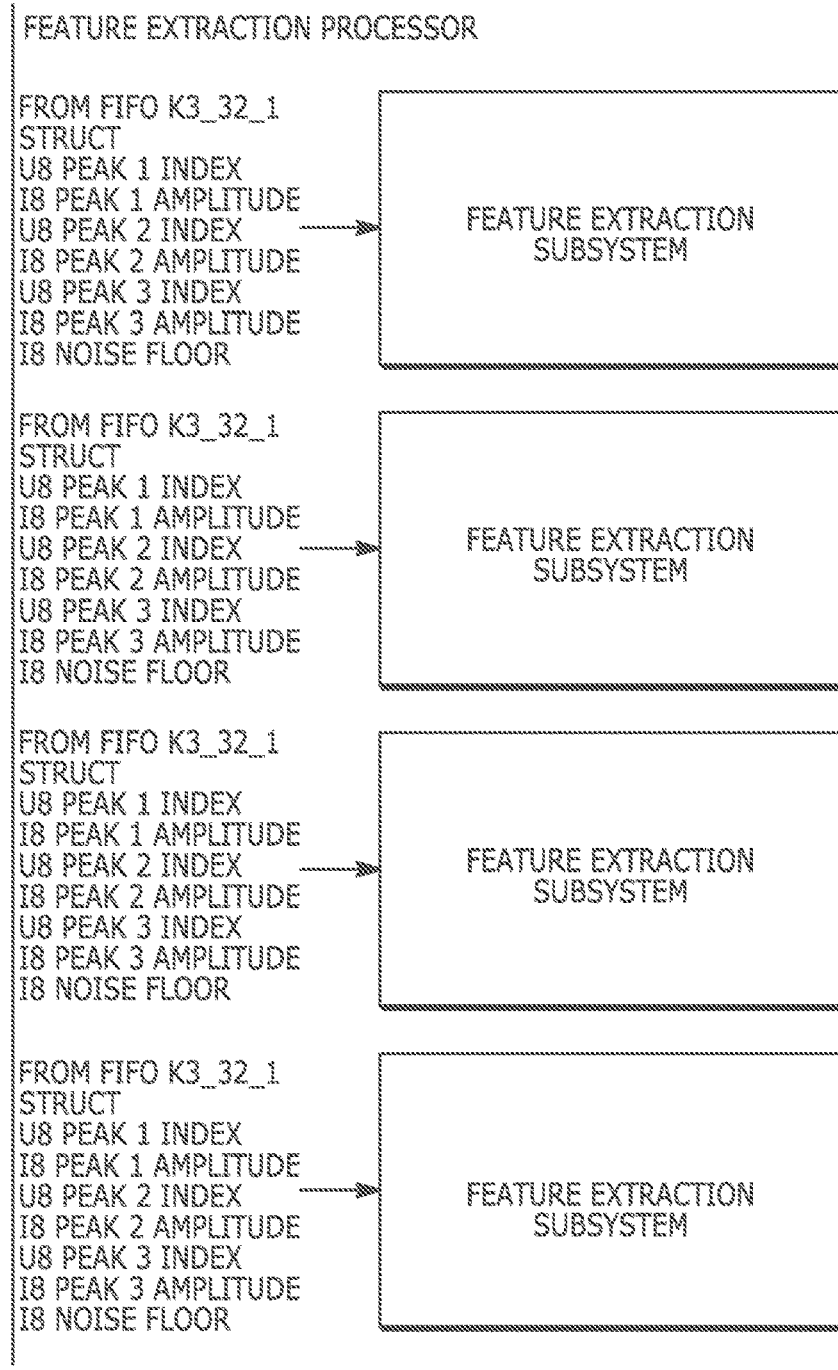
FIGS. 12A-12B are block diagrams illustrating one example of a pulse edge detector, also referred to as a feature extraction processor in accordance with one example set forth in the disclosure.
Figure 12B:
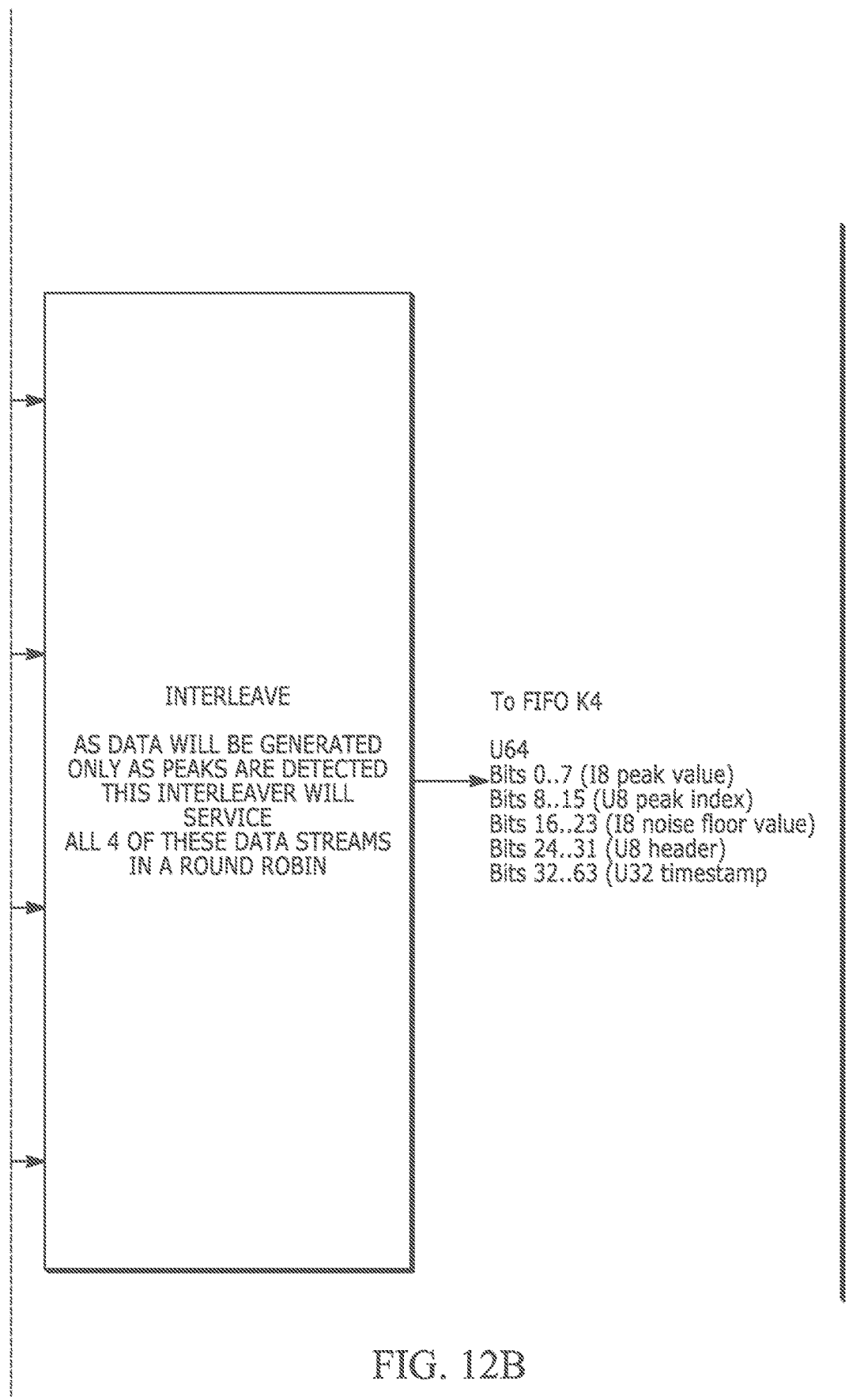
Figure 13:
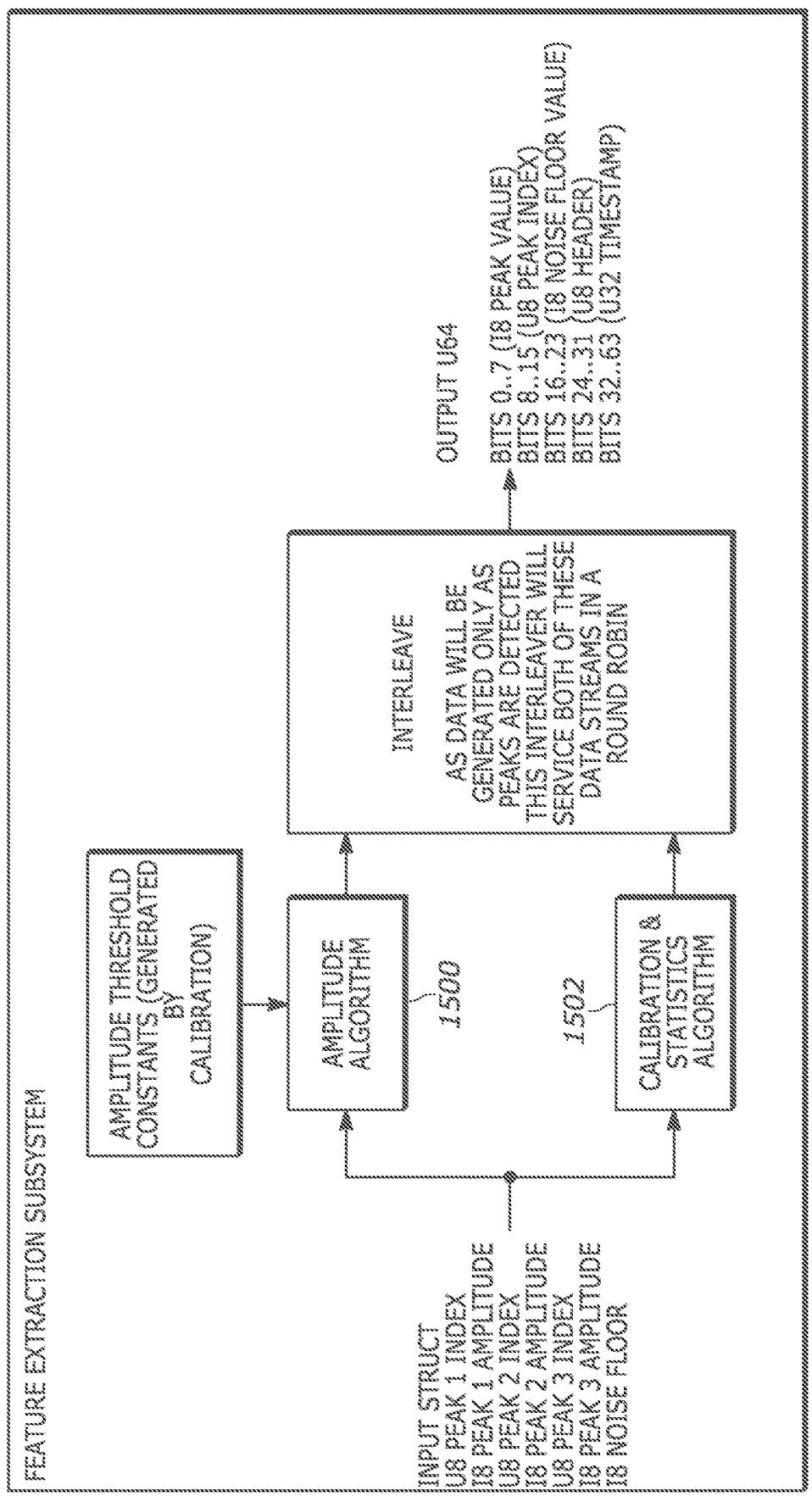
FIG. 13 is a block diagram illustrating one example of a peak extraction subsystem operation in accordance with one example set forth in the disclosure.

Referring to FIGS. 12A, 12B and 13, the feature extractor 610 takes the form of a processor that performs an amplitude tracking algorithm which is operated on all 4 data streams. The results of all of these algorithms are reported to the final FIFO for sending to the host over a common DMA. The final packet includes a 32 bit timestamp representing the 32 bit FFT count (as an FFT is performed every ~142 ns, this counter will roll over every 10 minutes so the host should be designed to handle this case), an 8 bit header representing the bit flags (to inform the host what algorithm, FFT length, channel and whether the event is the start of a pulse or end of a pulse), an 8 bit value representing the noise value at the last FFT of the peak, the peak index and the amplitude.

Amplitude algorithm: This algorithm is very simple in concept. The goal is to see if any peaks are greater than a threshold which is provided from the host (1 threshold for each channel for each FFT length). The algorithm then only outputs when a frequency bin exceeds a threshold and again when the same frequency bin falls below the threshold. This minimizes the number of packets sent to the host as a long pulse which stretches over many consecutive FFTs only results in 2 packets sent to the host.

The goal of the amplitude algorithm is to identify rising and falling edges of peaks which exceed a threshold while making sure the events are not caused by an elevated noise floor. This algorithm works by using an array of Boolean 'state_array' equal to the length of the FFT on whose data it is operating with its values initialized to False.

When a new struct of peaks and noise floor is fed into the algorithm a check is made for each of the three peak values that the peak is above the threshold while the noise floor is below the threshold value. This Boolean condition is then stored in the 'state_array' at the index of the peak.

The algorithm keeps a copy of the 'state_array' from the previous iteration, along with the peak values and indices and the noise floor. We shall refer to them with the suffix '_old' here and the current values with the suffix '_new'. The algorithm keeps an array of length of the FFT and stores the maximum values and the corresponding noise floor values. These values are reset to −128 on reaching a falling edge.

At each iteration a check is made at the 3 current peak indices and the 3 peak indices from the previous iterations on both 'state_array_new' and 'state_array_old'. If 'state_array_old' at a given index is True while 'state_array_new' shows a False, that indicates a falling edge of a peak and in this case the max value, index and noise floor from the stored array is output along with header and timestamp. If 'state_array_old' at a given index is False while 'state_array_new' shows a True, that indicates the rising edge of a peak and in this case the peak value, index and noise floor from the current iteration is output along with the header and timestamp. If 'state_array_old' at a given index is True while 'state_array_new' shows a True that indicates we are still in the middle of a peak and in this case we do not output anything. If 'state_array_old' at a given index is False while 'state_array_new' shows a False we do not output anything.

The header is defined by 4 conditions. Edge (Rising=0, Falling=1), Channel (Channel 1=0, Channel 2=1), FFT length (32 point=0, 128 point=1), Algorithm type (Amplitude algorithm=0, Peak tracking algorithm=1). The header is stored in a U8. Bits 0 . . . 1 represent the edge. Bits 2 . . . 3 represent Channel. Bits 4 . . . 5 represent FFT length and Bits 6 . . . 7 represent Algorithm type.

Figure 14:
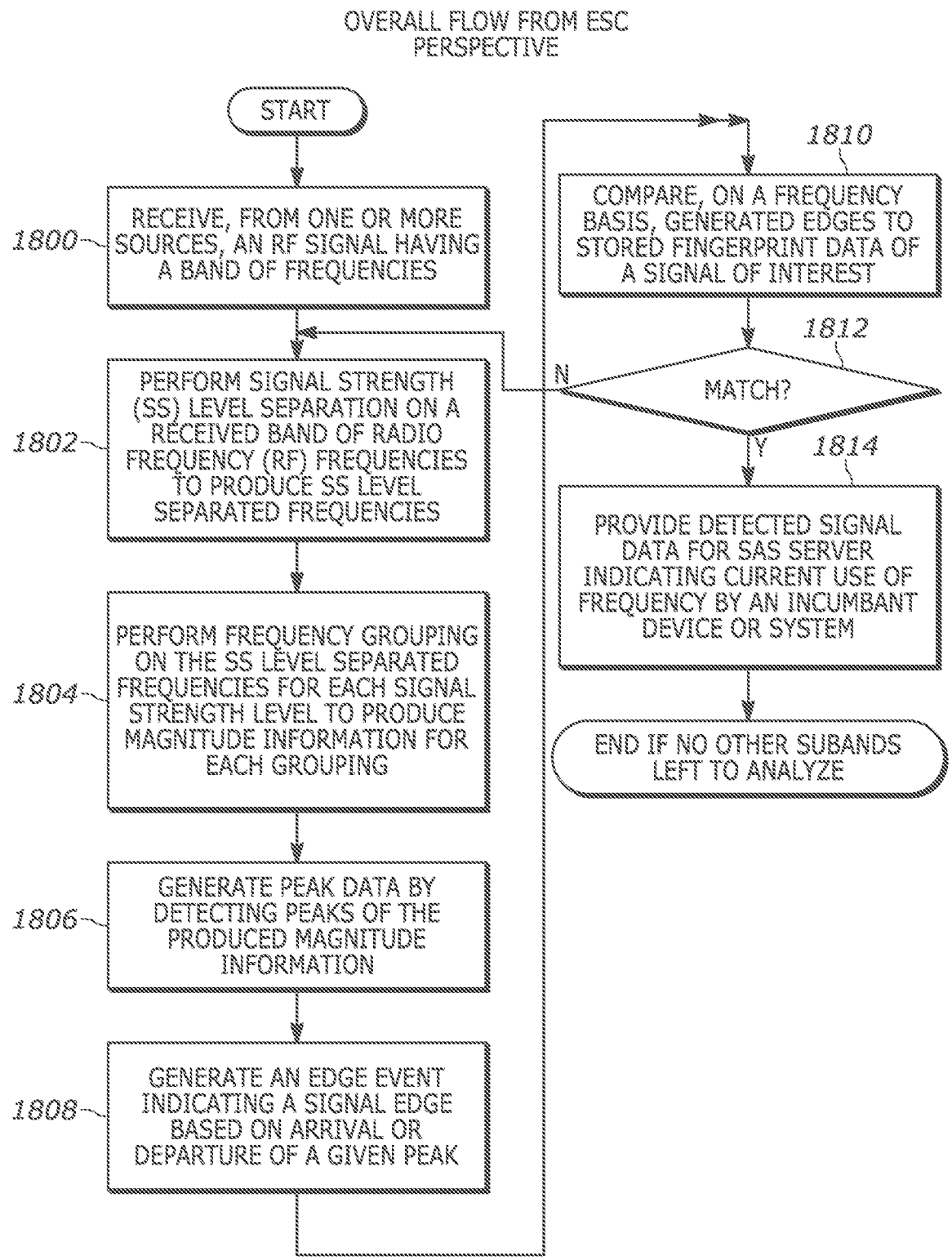
FIG. 14 is a block diagram illustrating one example of a method for providing frequency spectrum analysis in accordance with one example set forth in the disclosure.

Referring to FIG. 14, the method for assessing radio frequency spectrum use as performed by the environmental frequency sensing device is shown. In this example, the RF signal strength separator 200, the controller 204 and the host unit 231 perform operations as described. However, any suitable structure may be employed. As shown in block 1800, the method includes receiving, from one or more sources, such as base station 116, an RF signal having a band of frequencies. Receiving may be carried out, for example, by the RF signal strength separator 200 as receiving the signals from the left and right antennas. As shown in block 1802, the method includes performing signal strength level separation on the received band of frequencies and producing signal strength level separated frequencies information 216-222. This is done, for example, by the RF signal strength separator 200 having received RF signals in the 3550-3700 MHz range. As shown in block 1804, the method includes, performing frequency grouping on the SS level separated frequencies that are associated with each signal strength level to produce magnitude information for each grouping. This is performed, for example, by the controller 204. In one example, short duration pulses and long duration pulses are detected from the separated signal strength signals in the signal strength level separated frequencies information 216-222 output by the RF SS 200. The pulse filtering in this example is performed by the STFT processor 606.

As shown in block 1806, the method includes generating peak data shown as 612 by detecting peaks of the detected magnitude information. For example, peaks that are beyond a threshold for each pulse type, such as a detected short pulse or detected long pulse has its peak detected by the peak extraction processor 608 as described above. As shown in block 1808, the method includes generating an edge event indicating a signal edge based on arrival or departure of a given peak. This is performed by the pulse edge detector 610. The process is carried out by the ESC signal processor 502 and is performed in real time and hence the system described performs a real time spectral analysis.

As shown in block 1810, the method includes comparing, on a frequency basis, the generated edges to stored fingerprint data of a signal of interest. This is done by the host unit 231 in this example. As noted above the fingerprint information can include any suitable criteria to determine whether a frequency or range of frequencies has been detected by the detectors.

As shown in block 1812, if a match exists, the detected signal data 232 is provided for the SAS server, however it will be recognized that the SAS server can perform operations of the sensor such as determining if a match occurs, as well as any other suitable operations. The detected signal data 232 indicates a current use of a range of frequencies by an incumbent device, base station, system or any other source of the wireless RF spectrum that has been detected. This is shown in block 1814. The process repeats for each 100 MHz sub-band within a band of received signals until no other sub-bands are left. Referring back to block 1812, if no match is detected, the process proceeds to perform signal strength level separation on received frequencies to continue the process.

Figure 15:
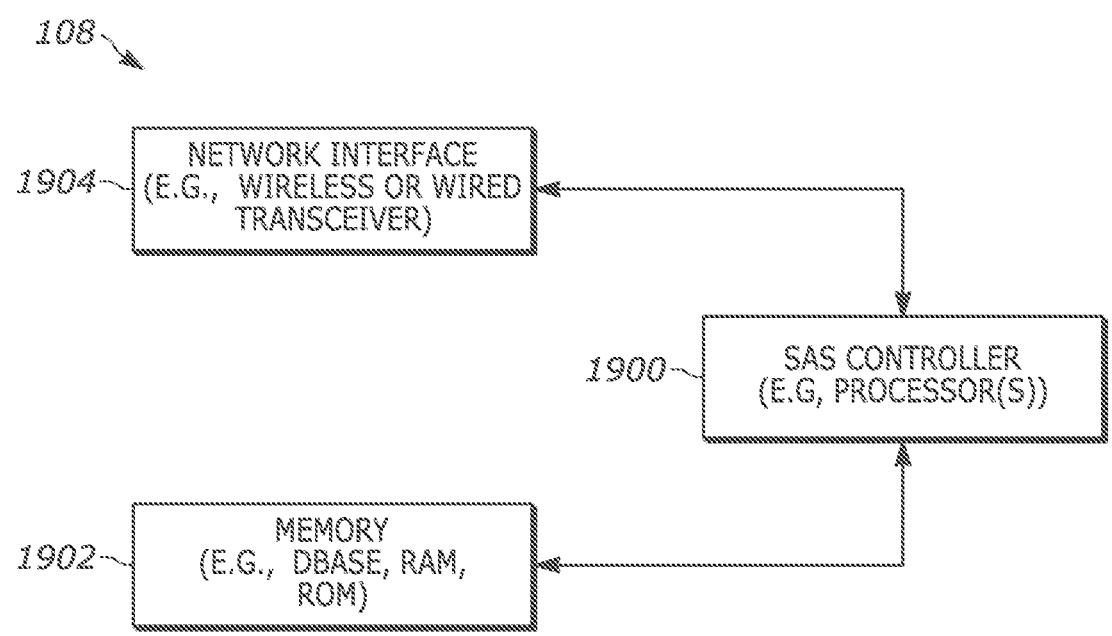
FIG. 15 is one example of a spectrum analysis access server in accordance with one example set forth in the disclosure.

FIG. 15 is a block diagram of the SAS server 108 which in this example, includes one or more processors 1900, memory 1902 that can serve as one or more databases, memory to store executable instructions that when executed by the one or more processors 1900, causes the one or more processors to carry out the operations described herein. A network interface 1904 is also in communication with the processors to allow the processor to communicate with the environmental RF sensors and any other suitable network element.

Figure 16:
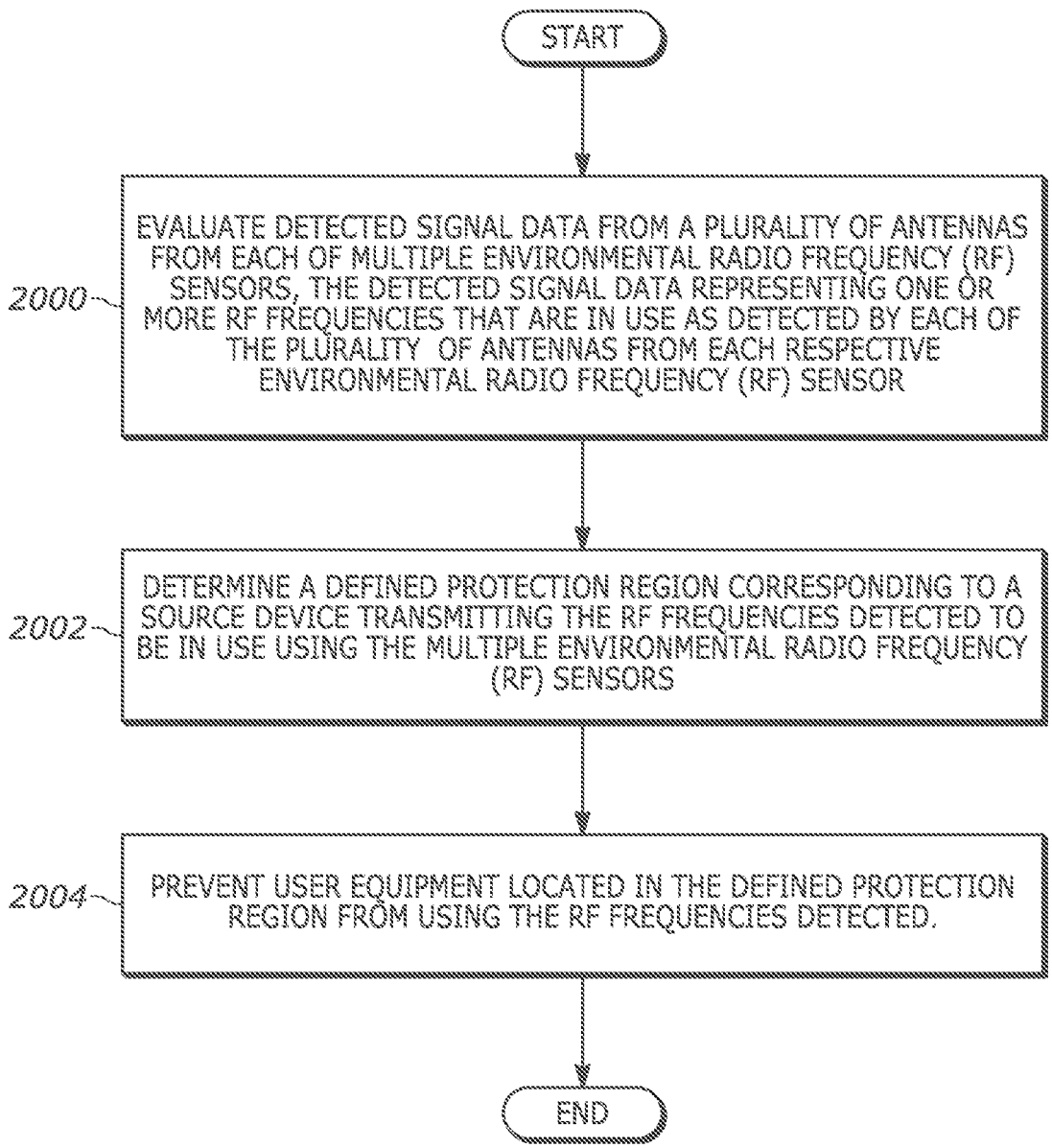
FIG. 16 is a block diagram illustrating one example of a method of operation of a spectrum analysis access server in accordance with one example set forth in the disclosure.

Referring to FIG. 16, an example of a method carried out by the SAS server 108 is shown. The method includes evaluating detected signal data from a plurality of antennas from each of multiple environmental radio frequency (RF) sensors, the detected signal data representing one or more RF frequencies that are in use as detected by each of the plurality of antennas from each respective environmental radio frequency (RF) sensor. This is shown in block 2000. As shown in block 2002, the method includes determining a defined protection region corresponding to a source device transmitting the RF frequencies detected to be in use using the multiple environmental radio frequency (RF) sensors. This may include, for example, employing location information from each of the antennas from the environmental RF sensors which may include GPS location information. For example, frequency use detection is performed at the environmental RF sensors in this example as described above. A cloud based decision engine (e.g., one or more programmed processors) in the SAS server 108 determines, for example, frequency use in a particular geographic area of interest by the source device. As shown in block 2004 the method includes preventing user equipment located in the defined protection region from using the RF frequencies detected. The geographic area is then protected by not allowing use of the detected frequencies in a that geographic area. In this example, being protected includes not assigning use of the frequency to other devices because it has been determined that a government device or other incumbent device is already using the frequency or frequency range of interest. In one example, the detected signal data received from the environmental RF sensors includes signal data from each of a right and left antenna. The decision engine in the SAS sever identifies that the detected signal data is coming from multiple environmental RF sensors that are geographically adjacent to each other. In other examples the system detects that frequencies are not in use and causing commercial devices or other devices to be assigned use of the undetected frequencies.

Figure 17:
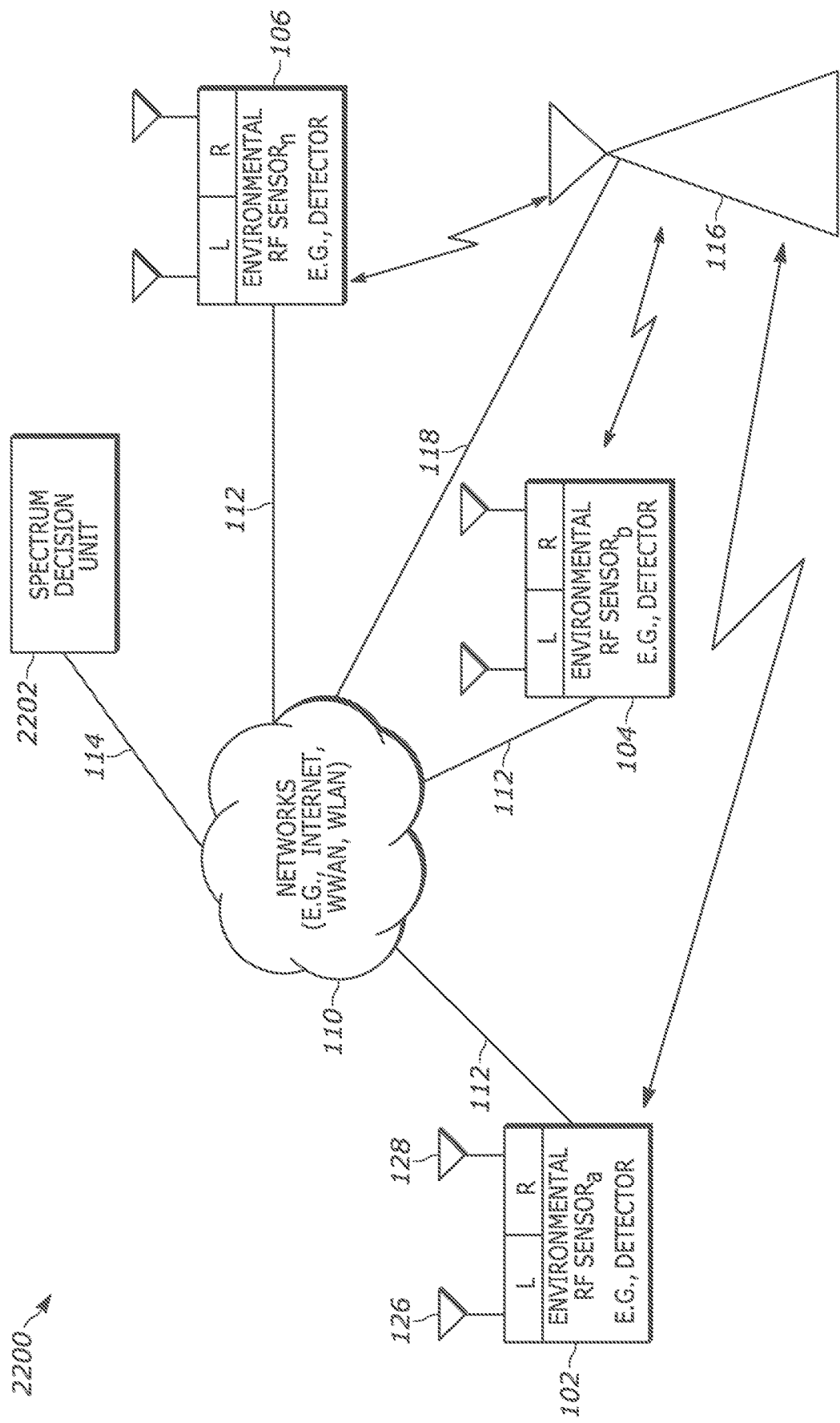
FIG. 17 is a block diagram of an example of a spectrum detection system in accordance with one example set forth in the disclosure.

FIG. 17 illustrates another system 2200 that does not employ a spectrum analysis access server 108 but instead employs a device, such as a server, that is a spectrum decision unit 2202. In this example, frequency reassignment need not be employed. Instead, the spectrum decision unit 2202 determines whether frequencies of interest are being produced by the source device 116. The spectrum decision unit 2202 may operate as previously described to determine the location of the source device unit 116 within a geographic area and the geographic area is protected as previously described. The spectrum decision unit 2202 need not be a server, such as a web server, but may be any suitable device that is in communication with the environmental RF sensors 102-106. As noted above, the source device 116 may be a mobile device or non-mobile device depending upon the particular system design.

In another example, the SAS server or spectrum decision unit compares the data representing the one or more frequencies detected via each of the multiple antennas from each of the multiple environmental radio frequency sensors to be in use, to each other, to determine whether at least one of the environmental radio frequency sensors provided data containing error. For example, if three sensors are employed, if one of the sensors detects use of a frequency but the two others do not and the location of the other two sensors is known, the SAS server can infer that the detection by the one sensor should not be given high weight or should be given no weight at all since the other sensors should have detected similar frequency use.

Figure 18:
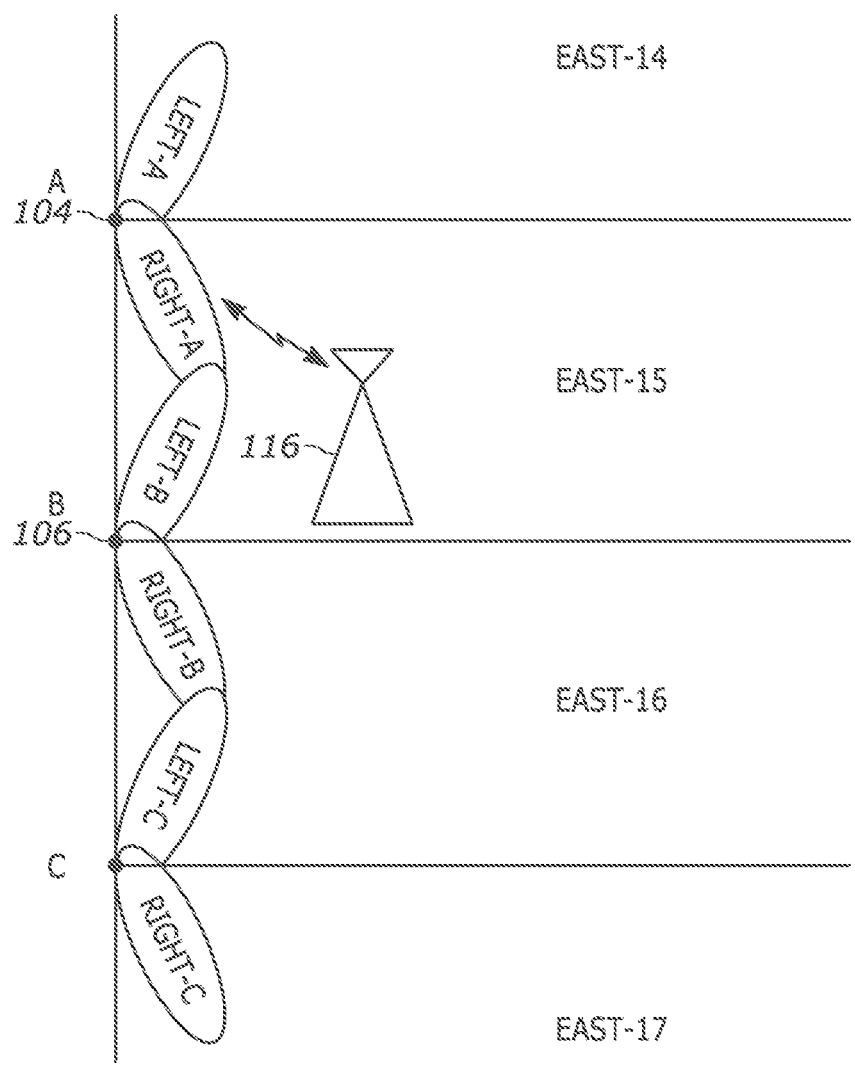
FIG. 18 diagrammatically illustrates geographic area protection in accordance with an example set forth in the disclosure.

Referring to FIG. 18, the RF source device 116 would potentially be detected by right-A, left-B and right-B antennas of environmental RF sensors 104 and 106. The cloud decision engine determines that the detected signal is coming from between "A" and "B" and from there, the east-15 geographic area is designated as protected. This results in not allowing any new devices to be granted access to the frequency spectrum provided by the source device 116 in this area. If the source device 116 is further south in the diagram, RF sensor 106 would indicate that both left-B and right-B antennas were detecting the signal and such a detection would result in the cloud decision engine protecting both east-15 and east-16 geographic areas. As such, when a source device location is known but no RF frequency use is detected and the frequencies have been previously assigned to government devices but the devices are not using the spectrum, other commercial devices, for example, are assigned to those frequencies that are not determined to be in use.

Stated another way, the spectrum decision unit 2202 or the SAS server evaluates detected signal data from a plurality of antennas (e.g., co-located left and right antennas) from each of multiple environmental radio frequency (RF) sensors. The detected signal data represents one or more RF frequencies that are in use as detected by each of the plurality of antennas from each respective environmental radio frequency (RF) sensor. The spectrum decision unit determines a defined protection region (e.g., a geographic area) corresponding to a source device that is transmitting the RF frequencies detected to be in use using the multiple environmental radio frequency (RF) sensors. The spectrum decision unit prevents user equipment located in the defined protection region from using the RF frequencies detected through any suitable app notification on the device, through a network connection such as a WWAN or WLAN connection or through any suitable mechanism.

In the preceding detailed description of the preferred embodiments, reference has been made to the accompanying drawings which form a part thereof, and in which is shown by way of illustration specific preferred embodiments in which the invention may be practiced. These embodiments are described in sufficient detail to enable those skilled in the art to practice the invention, and it is to be understood that other embodiments may be utilized and that logical, mechanical, and electrical changes may be made without departing from the scope of the invention. To avoid detail not necessary to enable those skilled in the art to practice the invention, the description may omit certain information known to those skilled in the art. Furthermore, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the scope of the invention. The preceding detailed description is, therefore, not to be taken in a limiting sense, and the scope of the present invention is defined only by the appended claims. The above detailed description of the embodiments and the examples described therein have been presented for the purposes of illustration and description only and not by limitation. It is therefore contemplated that the present invention cover any and all modifications, variations or equivalents that fall within the scope of the basic underlying principles disclosed above and claimed herein.

What is claimed is:

1. An environmental frequency sensing device comprising logic operative to:
    perform signal strength (SS) level separation on a received band of radio frequency (RF) frequencies to produce SS level separated frequencies based on a signal strength of each RF frequency;
    perform frequency grouping on the SS level separated frequencies for each signal strength level of the SS level separated frequencies to produce respective magnitude information for each grouping;
    generate peak data by detecting peaks of the produced respective magnitude information;
    generate, using the peak data, edge events, each edge event indicating a signal edge based on arrival or departure of a given peak;
    compare, on a frequency basis, the generated edge events to stored fingerprint data of a signal of interest, the signal of interest associated with a known source of RF frequencies;
    based on the comparison, determine that at least a portion of the SS level separated frequencies are generated by the known source associated with the signal of interest; and
    based on the determination, provide detected signal data indicating current use of a range of frequencies by the known source.

2. The device of claim 1, further comprising a plurality of co-located directional antennas operatively coupled to the logic and wherein the logic is operative to provide the detected signal data to a spectrum analysis access server.

3. The device of claim 1 wherein generating an edge event comprises generating real time edge up and edge down detection of frequencies over a wide band range.

4. A method for providing frequency spectrum analysis, the method comprising:
    performing signal strength (SS) level separation on a received band of radio frequency (RF) frequencies to produce SS level separated frequencies based on a signal strength of each RF frequency;
    performing frequency grouping on the SS level separated frequencies for each signal strength level of the SS level separated frequencies to produce respective magnitude information for each grouping;
    generating peak data by detecting peaks of the produced respective magnitude information;
    generating, using the peak data, edge events, each edge event indicating a signal edge based on arrival or departure of a given peak;
    comparing, on a frequency basis, the generated edge events to stored fingerprint data of a signal of interest, the signal of interest associated with a known source of RF frequencies;
    based on the comparison, determining that at least a portion of the SS level separated frequencies are generated by the known source associated with the signal of interest; and
    based on the determination, providing detected signal data indicating current use of a range of frequencies by the known source.

5. The method of claim 4, further comprising receiving the received band of radio frequency frequencies from a plurality of co-located directional antennas and wherein generating an edge event comprises generating real time edge up and edge down detection of frequencies over a wide band range.

6. The method of claim 4, further comprising:
    evaluating the detected signal data and determining a defined protection region corresponding to the source transmitting the RF frequencies detected to be in use using multiple environmental RF sensors; and
    preventing user equipment located in the defined protection region from using the RF frequencies detected.

* * * * *